(12) United States Patent
McDonald

(10) Patent No.: US 12,127,352 B2
(45) Date of Patent: Oct. 22, 2024

(54) BRACKET FOR MOUNTING LOAD CONTROL MODULE TO WALL BOX

(71) Applicant: LUTRON TECHNOLOGY COMPANY LLC, Coopersburg, PA (US)

(72) Inventor: Matthew P. McDonald, Phoenixville, PA (US)

(73) Assignee: Lutron Technology Company LLC, Coopersburg, PA (US)

(*) Notice: Subject to any disclaimer, the term of this patent is extended or adjusted under 35 U.S.C. 154(b) by 11 days.

(21) Appl. No.: 17/664,347

(22) Filed: May 20, 2022

(65) Prior Publication Data

US 2022/0279665 A1 Sep. 1, 2022

Related U.S. Application Data

(63) Continuation-in-part of application No. 17/168,782, filed on Feb. 5, 2021, now Pat. No. 11,670,468.

(60) Provisional application No. 63/191,625, filed on May 21, 2021, provisional application No. 63/086,826, filed on Oct. 2, 2020, provisional application No. 63/018,761, filed on May 1, 2020, provisional application No. 62/971,591, filed on Feb. 7, 2020.

(51) Int. Cl.
| | |
|---|---|
| *H05K 5/00* | (2006.01) |
| *H05K 5/02* | (2006.01) |
| *H05K 7/14* | (2006.01) |
| *F21Y 115/10* | (2016.01) |

(52) U.S. Cl.
CPC ......... *H05K 5/0017* (2013.01); *H05K 5/0217* (2013.01); *H05K 7/1427* (2013.01); *F21Y 2115/10* (2016.08)

(58) Field of Classification Search
CPC ... H05K 5/0017; H05K 5/0217; H05K 7/1427
USPC ................................ 361/752, 728, 796, 800
See application file for complete search history.

(56) References Cited

U.S. PATENT DOCUMENTS

| | | | |
|---|---|---|---|
| 3,174,023 | A | 3/1965 | Doggart |
| 3,864,561 | A | 2/1975 | Spira et al. |
| 5,017,837 | A | 5/1991 | Hanna et al. |
| 6,687,487 | B1 | 2/2004 | Mosebrook et al. |
| 6,803,728 | B2 | 10/2004 | Balasubramaniam et al. |
| 7,515,062 | B2 | 4/2009 | Brown et al. |

(Continued)

FOREIGN PATENT DOCUMENTS

| | | | | |
|---|---|---|---|---|
| CN | 206742111 U | | 12/2017 | |
| DE | 102021131353 | * | 6/2023 | ............... H02G 3/12 |

(Continued)

OTHER PUBLICATIONS

Lisa Eitel, Retaining Rings basics video: Stamped, eared, e-clip, and constant section, Jan. 13, 2018 (Year: 2018).

(Continued)

*Primary Examiner* — Hung S. Bui
(74) *Attorney, Agent, or Firm* — Duane Morris LLP

(57) ABSTRACT

A mounting bracket for coupling a control device to a wall box is disclosed. The mounting bracket may include a body having an inner perimeter defining an opening. A plurality of flanges may extend into the opening. Each flange of the plurality of flanges may be configured to be engaged by an arm of a faceplate for coupling the faceplate to the mounting bracket.

25 Claims, 23 Drawing Sheets

(56) References Cited

U.S. PATENT DOCUMENTS

| | | | |
|---|---|---|---|
| 7,608,948 | B2 | 10/2009 | Nearhoof et al. |
| 7,692,111 | B1 | 4/2010 | Rosing et al. |
| 7,745,750 | B2 | 6/2010 | Hewson et al. |
| 7,796,057 | B2 | 9/2010 | Swatsky et al. |
| 7,837,344 | B2 | 11/2010 | Altonen et al. |
| 8,173,920 | B2 | 5/2012 | Altonen et al. |
| 8,658,894 | B1 * | 2/2014 | Witherbee ............. H02G 3/14 174/67 |
| 9,141,101 | B2 | 9/2015 | Carmen et al. |
| 9,167,666 | B1 | 10/2015 | Billheimer et al. |
| 9,368,025 | B2 | 6/2016 | Carmen, Jr. |
| 9,553,451 | B2 | 1/2017 | Zacharchuk et al. |
| 9,763,302 | B2 | 9/2017 | McDonald et al. |
| 9,860,952 | B2 | 1/2018 | Twaddell et al. |
| 10,181,385 | B2 | 1/2019 | Bhate et al. |
| 10,782,188 | B2 | 9/2020 | Shivell et al. |
| 10,798,792 | B2 | 10/2020 | McDonald et al. |
| 2003/0112160 | A1 | 6/2003 | Hsiung et al. |
| 2004/0134765 | A1 | 7/2004 | Sotome |
| 2004/0163936 | A1 | 8/2004 | Clegg et al. |
| 2005/0230236 | A1 | 10/2005 | Suzuki et al. |
| 2005/0269196 | A1 | 12/2005 | Brown et al. |
| 2006/0225995 | A1 | 10/2006 | Ohnishi |
| 2006/0254895 | A1 | 11/2006 | Tsubota et al. |
| 2007/0217211 | A1 | 9/2007 | Hewson et al. |
| 2008/0237010 | A1 | 10/2008 | Patel et al. |
| 2010/0084253 | A1 | 4/2010 | Bollmann et al. |
| 2010/0148996 | A1 | 6/2010 | Wang |
| 2010/0302166 | A1 | 12/2010 | Zhang |
| 2011/0122082 | A1 | 5/2011 | Orellana |
| 2011/0181446 | A1 | 7/2011 | Brian |
| 2013/0016053 | A1 | 1/2013 | Jung |
| 2013/0162450 | A1 | 6/2013 | Leong et al. |
| 2014/0027259 | A1 | 1/2014 | Kawana et al. |
| 2014/0125463 | A1 | 5/2014 | Carmen, Jr. et al. |
| 2016/0035217 | A1 | 2/2016 | Camden et al. |
| 2016/0069537 | A1 | 3/2016 | Dimberg et al. |
| 2016/0073467 | A1 | 3/2016 | McDonald et al. |
| 2016/0307714 | A1 | 10/2016 | Bhate et al. |
| 2016/0353543 | A1 | 12/2016 | Twaddell et al. |
| 2017/0053753 | A1 | 2/2017 | Adams et al. |
| 2017/0102493 | A1 | 4/2017 | Shivell et al. |
| 2017/0330704 | A1 | 11/2017 | Chen |
| 2018/0174777 | A1 | 6/2018 | Clementson |
| 2018/0233303 | A1 | 8/2018 | Wu et al. |
| 2019/0115731 | A1 | 4/2019 | Wisniewski |
| 2019/0230762 | A1 | 7/2019 | McDonald et al. |
| 2019/0252137 | A1 | 8/2019 | McDonald et al. |

FOREIGN PATENT DOCUMENTS

| | | |
|---|---|---|
| EP | 1511050 B1 | 11/2017 |
| WO | 2016141062 A2 | 9/2016 |

OTHER PUBLICATIONS

International Search Report and Written Opinion for PCT International Application No. PCT/US2021/016847 issued May 6, 2021.

International Search Report and Written Opinion for PCT International Application No. PCT/US2022/072477 issued Sep. 7, 2022.

Anonymous, "Homeworks Wired Alisse Keypad", Mar. 2021 pp. 1-16, XP055955889, Retrieved from the Internet: <https://www.lutron.com/TechnicalDocumentLibrary/3691154_ENG.pdf> [retrieved on Aug. 29, 2022].

Anonymous, "Clavier Alisse raccord8 au Homeworks", Oct. 2020, pp. 1-15, XP055955890, Retrieved from the Internet: <https://www.lutron.com/TechnicalDocumentLibrary/3691154_FRE.pdf>[retrieved on Aug. 29, 2022].

Lutron Electronics, "Al:isse Wall Control Installation", Dec. 2020, XP055955979, Retrieved from the Internet: <https://www.youtube.com/watch?v=DCejnd wOfuc> [retrieved on Aug. 30, 2022].

Anonymous: "Le Lab presente l'interrupteur a couronne lumineuse—Espace Grand Public I Legrand", Mar. 15, 2017 (Mar. 15, 2017), XP055594454, Retrieved from the Internet: https ://www. leg rand. fr/actualites/le-lab-by-leg rand-prsente-fonctions-lu mi neuses [retrieved on Apr. 29, 2020] the whole document.

* cited by examiner

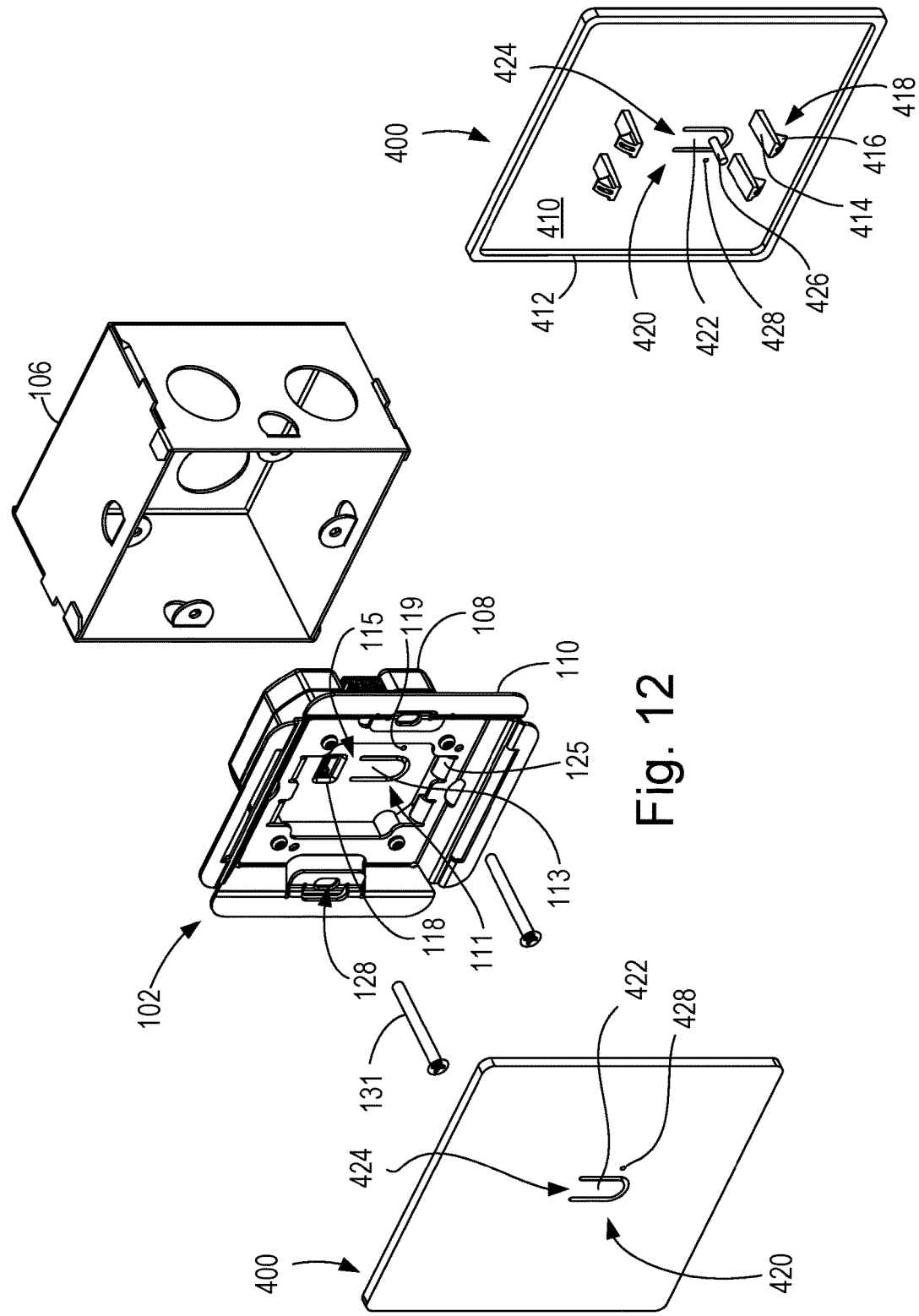

BRACKET FOR MOUNTING LOAD CONTROL MODULE TO WALL BOX

CROSS-REFERENCE TO RELATED APPLICATIONS

This application is a continuation-in-part of U.S. patent application Ser. No. 17/168,782, which was filed on Feb. 5, 2021 claiming priority to U.S. Provisional Patent Application Nos. 63/086,826, filed Oct. 2, 2020; 63/018,761, filed May 1, 2020; and 62/971,591, filed Feb. 7, 2020, the entireties of which are incorporated by reference herein. This application also claims priority to U.S. Provisional Patent Application No. 63/191,625, filed May 21, 2021, and entitled "Bracket for Mounting Load Control Module to Wall Box," the entirety of which is incorporated herein by reference.

BACKGROUND

Home automation systems, which have become increasing popular, may be used by homeowners to integrate and control multiple electrical and/or electronic devices in their house. For example, a homeowner may connect appliances, lights, blinds, thermostats, cable or satellite boxes, security systems, telecommunication systems, and the like to each other via a wireless network. The homeowner may control these devices using a controller, a remote control device (such as a wall-mounted keypad), or user interface provided via a phone, a tablet, a computer, and the like directly connected to the network or remotely connected via the Internet. These devices may communicate with each other and the controller to improve, for example, their efficiency, their convenience, and/or their usability. The control devices may be configured to provide feedback, for example, by illuminating one or more visual indicators, to indicate a state and/or present level of the system, the control device, and/or one or more of the electrical loads.

SUMMARY

In some aspects, a control device for controlling power delivered to an electrical load is disclosed. The control device may include a faceplate subassembly, a main control module, and a mounting bracket. The faceplate subassembly may include a front surface, an opposed rear surface, and an attachment member. The attachment member may include a plurality of arms extending away from the rear surface of the faceplate subassembly. The main control module may be configured to cause power delivered to an electrical load to be adjusted in response to an actuation of a button. The mounting bracket may include a body defining an opening. The body may include a plurality of flanges with each flange of the plurality of flanges extending into the opening. The mounting bracket may be configured to be coupled to the main control module. Each arm of the plurality of arms of the attachment member may be configured to engage a respective flange of the body of the mounting bracket for coupling the faceplate subassembly to the mounting bracket.

In some aspects, the mounting bracket may include at least one aperture sized and configured to receive a screw for coupling the mounting bracket to a wall box. The mounting bracket may be configured to be coupled to the main control module by at least one second screw.

In some aspects, each arm of the plurality of arms of the attachment member may be configured to flex.

In some aspects, each flange may curve away from a front side of the body.

In some aspects, the body of the mounting bracket may include at least one arm extending beyond an outer edge of the body of the mounting bracket.

In some aspects, the at least one arm of the mounting bracket may be sized and arranged to extend beyond the wall box when the mounting bracket is coupled to the wall box.

In some aspects, the at least one arm of the mounting bracket includes an orthogonal extension extending from a terminal end of the at least one arm. The orthogonal extension may be configured to apply a force against the faceplate when the faceplate is coupled to the mounting bracket.

In some aspects, the at least one arm of the mounting bracket may be coupled to the body of the mounting bracket by one or more connector arms.

In some aspects, the at least one arm of the mounting bracket may extend in a first direction, and the one or more connector arms extend in a second direction that is different from the first direction.

In some aspects, the one or more connector arms may be curved.

In some aspects, the rear surface of the faceplate subassembly may include one or more recesses for providing clearance for the one more connector arms.

In some aspects, a thickness of the faceplate subassembly may be less between the front surface and the one or more recesses and between the front surface and other areas of the rear surface of the faceplate.

In some aspects, the mounting bracket may define at least one channel. The at least one channel may be sized and configured to receive a tower extending from a surface of the attachment member for aligning the faceplate subassembly relative to the mounting bracket.

In some aspects, a mounting bracket for coupling a control device to a wall box is disclosed. The mounting bracket may include a body having an inner perimeter defining an opening. A plurality of flanges may extend into the opening. Each flange of the plurality of flanges may be configured to be engaged by an arm of a faceplate for coupling the faceplate to the mounting bracket.

In some aspects, the inner perimeter of the body may define at least one channel. The at least one channel may be sized and configured to receive a tower of an attachment member for aligning the faceplate with the mounting bracket.

In some aspects, the body of the mounting bracket may define at least one first aperture sized and configured to receive a first screw for coupling the body of the mounting bracket to a wall box. The body of the mounting bracket may define at least one second aperture for coupling the body to the control module.

In some aspects, the body may include at least one arm that extends beyond an outer edge of the body.

In some aspects, the at least one arm may be coupled to the body of by one or more connector arms.

In some aspects, the at least one arm may extend in a first direction and the one or more connector arms may extend in a second direction that is different from the first direction.

In some aspects, at least one orthogonal extension may extend from a terminal end of the at least one arm. The orthogonal extension may be configured to apply a force against the faceplate when the faceplate is coupled to the mounting bracket.

In some aspects, a control device may include a faceplate subassembly, a main control module subassembly, and a mounting bracket. The faceplate subassembly may include a faceplate, a button, and a local control module. The faceplate may include a front surface and an opposed rear surface. The faceplate may include an opening defined by a sidewall extending between the front surface and the rear surface. The button may be disposed in the opening such that a gap exists between the button and the sidewall defining the opening. The local control module may be coupled to the faceplate. The local control module may include a circuit board positioned adjacent to the rear surface of the faceplate such that depression of the button actuates a contact on the circuit board. The main control module subassembly may include a body and a main control module that may be electrically connected to the local control module. The main control module may be configured to cause power delivered to an electrical load to be adjusted in response to an actuation of the button and control at least one light source to illuminate the gap between the button and the sidewall defining the opening. The mounting bracket may be configured to be coupled to the main control module subassembly and the faceplate subassembly. The mounting bracket may include a body defining an opening and including at least one flange for coupling the faceplate subassembly to the mounting bracket.

In some aspects, the faceplate subassembly may include an attachment member. The attachment member may include at least one flexible arm configured to engage the at least flange for coupling the faceplate subassembly to the mounting bracket.

In some aspects, the mounting bracket may define at least one channel in communication with the opening. The at least one channel may be configured to receive a tower extending from the attachment member for aligning the faceplate subassembly with the mounting bracket.

In some aspects, the mounting bracket may include at least one arm extending beyond an edge of the body of the mounting bracket.

In some aspects, wherein the mounting bracket may include at least one connector arm extending in a first direction from the body. The at least one arm may be coupled to the connector arm and may extend in a second direction that is different from the first direction.

In some aspects, the rear surface of the faceplate may include one or more recesses for providing clearance for the one more connector arms.

In some aspects, a thickness of the faceplate may be less between the front surface of the faceplate and the one or more recesses and between the front surface of the faceplate and other areas of the rear surface of the faceplate.

In one aspect, a control device for controlling power delivered to an electrical load is disclosed. The control device may include a faceplate, a main control module, and a mounting bracket. The main control module may be configured to cause power delivered to an electrical load to be adjusted in response to an actuation of a button. The mounting bracket may include a body and at least one arm extending beyond an edge of the body of the mounting bracket. The mounting bracket may be configured to be coupled to the main control module. The faceplate may be configured to be coupled to the mounting bracket.

In some aspects, the mounting bracket may include at least one aperture sized and configured to receive a screw for coupling the mounting bracket to a wall box.

In some aspects, the mounting bracket may be configured to be coupled to the main control module by at least one second screw.

In some aspects, the at least one arm of the mounting bracket may extend beyond the wall box when the mounting bracket is coupled to the wall box.

In some aspects, an attachment member may be configured to couple the faceplate to the mounting bracket.

In some aspects, the attachment member may include at least one flex arm. The flex arm may be configured to engage the mounting bracket to couple the faceplate to the mounting bracket.

In some aspects, the at least one flex arm may be configured to engage a flange that extends into an opening defined by the mounting bracket.

In some aspects, the mounting bracket may define at least one channel. The at least one channel may be sized and configured to receive a tower extending from a surface of the attachment member for aligning the faceplate relative to the mounting bracket.

In some aspects, the at least one arm may define a hole sized and configured to receive a positioning pin of a shim therethrough.

In some aspects, the at least one arm may be coupled to the body of the mounting bracket by one or more connector arms.

In some aspects, the at least one arm may extend in a first direction, and the one or more connector arms may extend in a second direction with respect to the body of the mounting bracket. In some aspects, the first direction may be a horizontal direction, and the second direction may be a vertical direction.

In some aspects, the one or more connector arms may be curved.

In some aspects, the at least one arm of the mounting bracket may include an orthogonal extension extending from a terminal end of the at least one arm. The orthogonal extension may be configured to apply a force against the faceplate when the faceplate is coupled to the mounting bracket.

In some aspects, a mounting bracket for coupling a control device to a wall box is disclosed. The mounting bracket may include a body having an inner perimeter defining an opening and at least one arm. The body may be configured to be coupled to the control module and a wall box. The at least one arm may extend beyond an edge of the body and may be configured to extend beyond an edge of the wall box when the body is coupled to the wall box. The at least one arm may be configured to apply a force to a planar surface positioned flush with or protruding beyond the wall box. The edge of the body may be an outer edge of the body.

In some aspects, the body may define at least one aperture sized and configured to receive a first screw therethrough. The screw may be configured to couple the body to the wall box.

In some aspects, the body may be configured to be coupled to the control module by at least a second screw.

In some aspects, the body may define at least one channel in the inner perimeter. The at least one channel may be sized and configured to receive a tower of a faceplate therein for aligning the faceplate relative to the mounting bracket.

In some aspects, the at least one arm may define a hole sized and configured to receive a screw therethrough.

In some aspects, the at least one arm may be coupled to the body by one or more connector arms.

In some aspects, the at least one arm may extend in a first direction and the one or more connector arms may extend in a second direction that is different from the first direction. The first direction may be a horizontal direction with respect to the body, and the second direction may be a vertical direction with respect to the body.

In some aspects, at least one orthogonal extension may extend from a terminal end of the at least one arm. The orthogonal extension may be configured to apply a force against the faceplate when the faceplate is coupled to the mounting bracket.

In some aspects, a control device is disclosed. The control device may include a faceplate subassembly, a local control module, a main control subassembly, and a mounting bracket. The faceplate subassembly may include a faceplate, a button, and a local control module. The faceplate may include a front surface and an opposed rear surface. An opening may be defined by a sidewall and extend between the front surface and the rear surface. The button may be disposed in the opening such that a gap exists between the button and the sidewall defining the opening. The local control module may be coupled to the faceplate. The local control module may include a circuit board positioned adjacent to the rear surface of the faceplate such that depression of the button actuates a contact on the circuit board. The main control module subassembly may include a body and a main control module that may be configured to be electrically connected to the local control module. The main control module may be configured to cause power delivered to an electrical load to be adjusted in response to an actuation of the button and control at least one light source to illuminate the gap between the button and the sidewall defining the opening. The mounting bracket may include a body and at least one arm extending beyond an edge of the body of the mounting bracket. The mounting bracket may be configured to be coupled to the main control module subassembly and the faceplate subassembly.

In some aspects, the mounting bracket may include at least one flange extending into an opening defined by the body. The at least one flange may be configured to be engaged by a flexible arm of an attachment member for coupling the faceplate subassembly to the mounting bracket.

In some aspects, the mounting bracket may define at least one channel in communication with the opening. The at least one channel may be configured to receive a tower extending from the attachment member for aligning the faceplate subassembly with the mounting bracket.

In some aspects, the mounting bracket may include at least one connector arm extending in a first direction from the body. The at least one arm may be coupled to the connector arm and extends in a second direction that is different from the first direction.

BRIEF DESCRIPTION OF THE DRAWINGS

Certain embodiments will hereafter be described with reference to the accompanying drawings, wherein like reference numerals denote like elements. It should be understood, however, that the accompanying drawings illustrate only the various implementations described herein and are not meant to limit the scope of various technologies described herein.

FIGS. 12 and 13 illustrate a temporary faceplate that may be installed on the main control module subassembly of FIG. 5.

DETAILED DESCRIPTION

Figure 1:
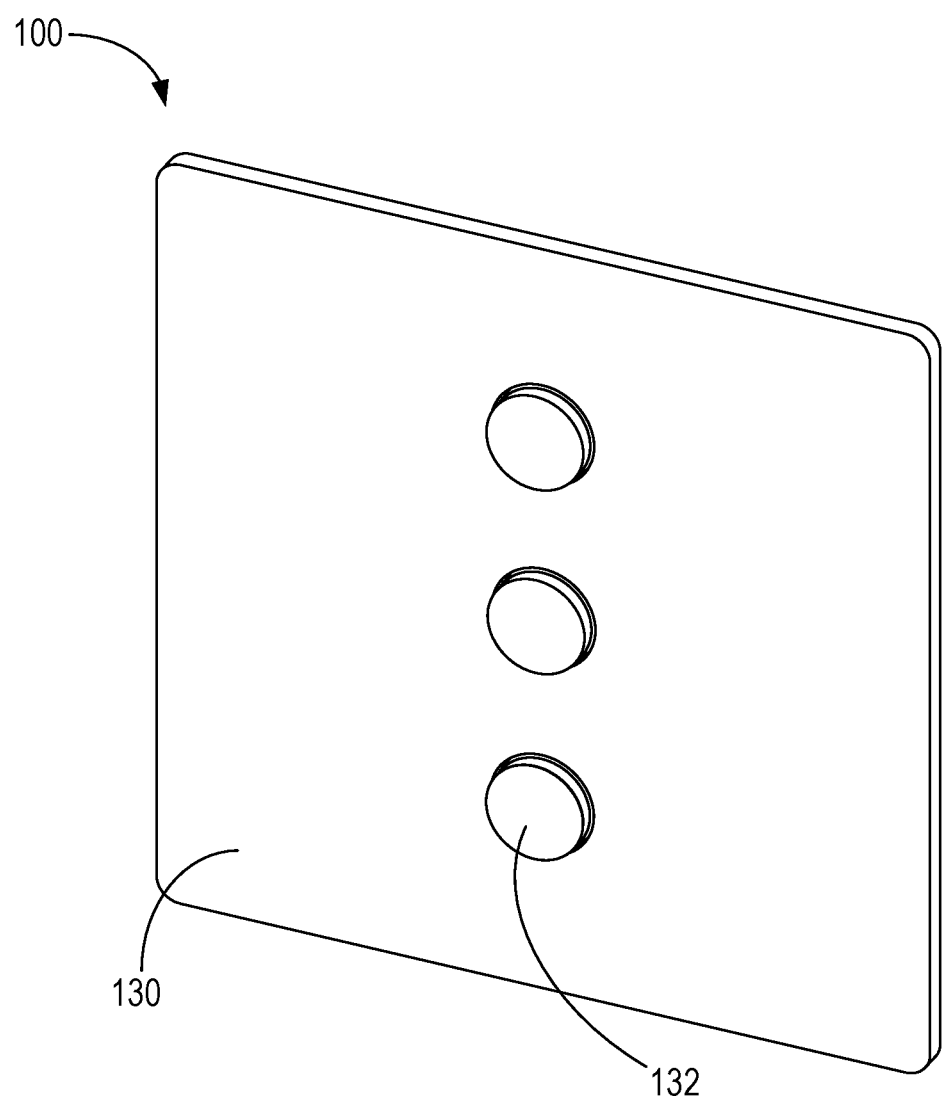
FIG. 1 is a perspective view of an example control device (e.g., a wall-mounted keypad) for use in a load control system for controlling the amount of power delivered to one or more electrical loads.

This description of the exemplary embodiments is intended to be read in connection with the accompanying drawings, which are to be considered part of the entire written description. The drawing figures are not necessarily to scale and certain features may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

The keypads described herein include a compact faceplate subassembly. Among other advantages, this allows one or more buttons of the keypad to be mounted outside of a perimeter of an electrical wall box to which the keypad is mounted. This provides significantly more freedom in designing the keypad and allows the buttons of the keypad to control a variety of electrical loads. Further, the keypads may include modular electrical connections to allow for easy connection to the electrical loads.

Figure 2:
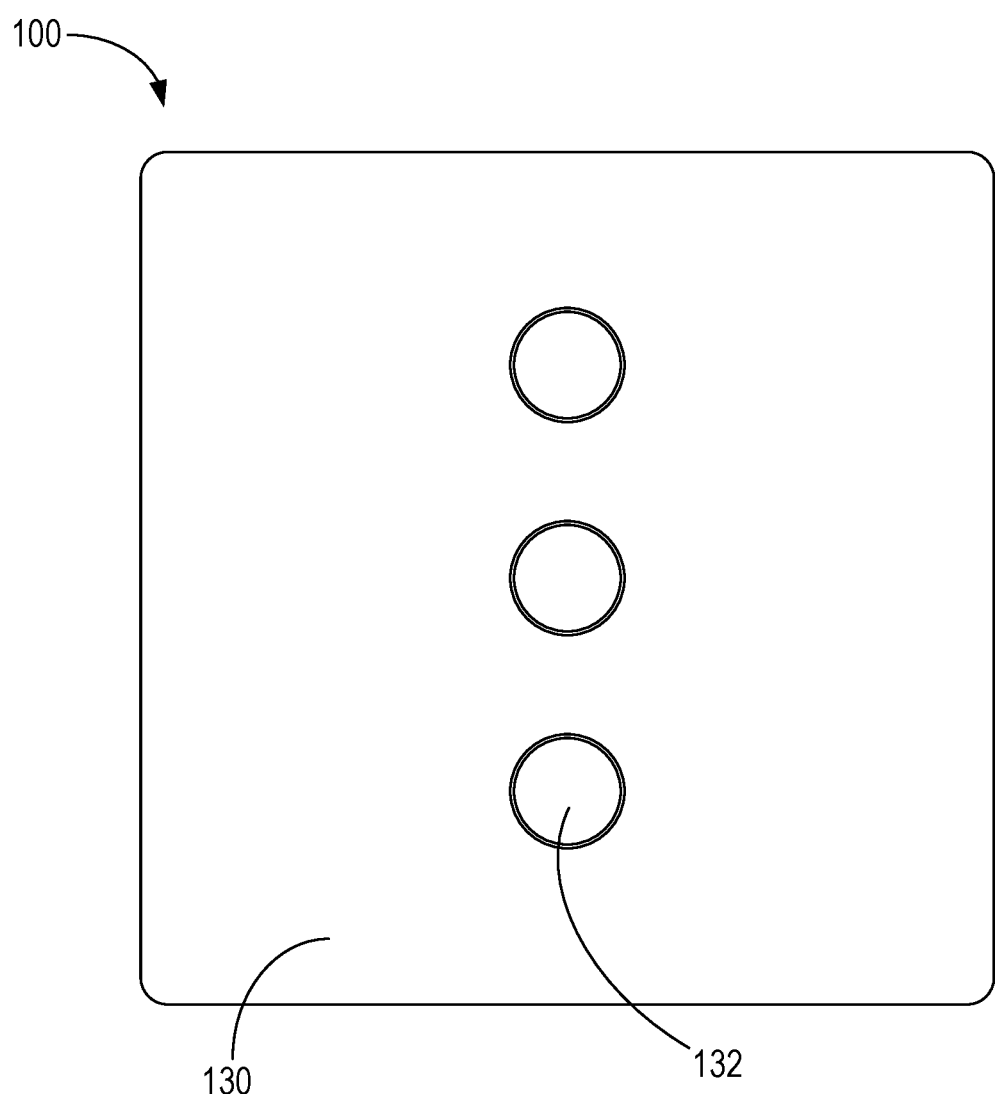
FIG. 2 is a front view of the control device of FIG. 1.
Figure 3:
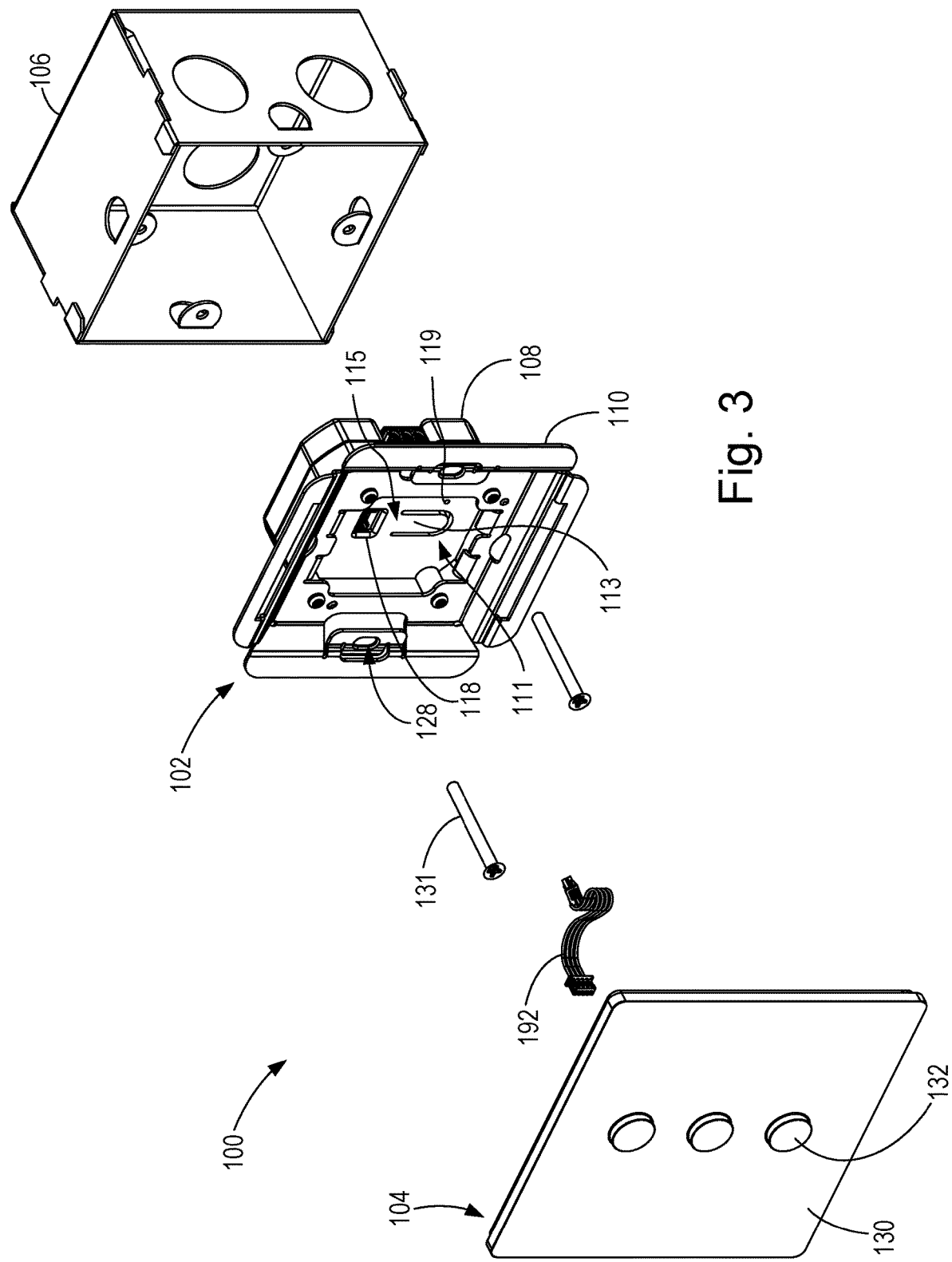
FIG. 3 is an exploded front perspective view of the control device of FIG. 1 along with a wall box to which the control device is configured to be mounted.
Figure 4:
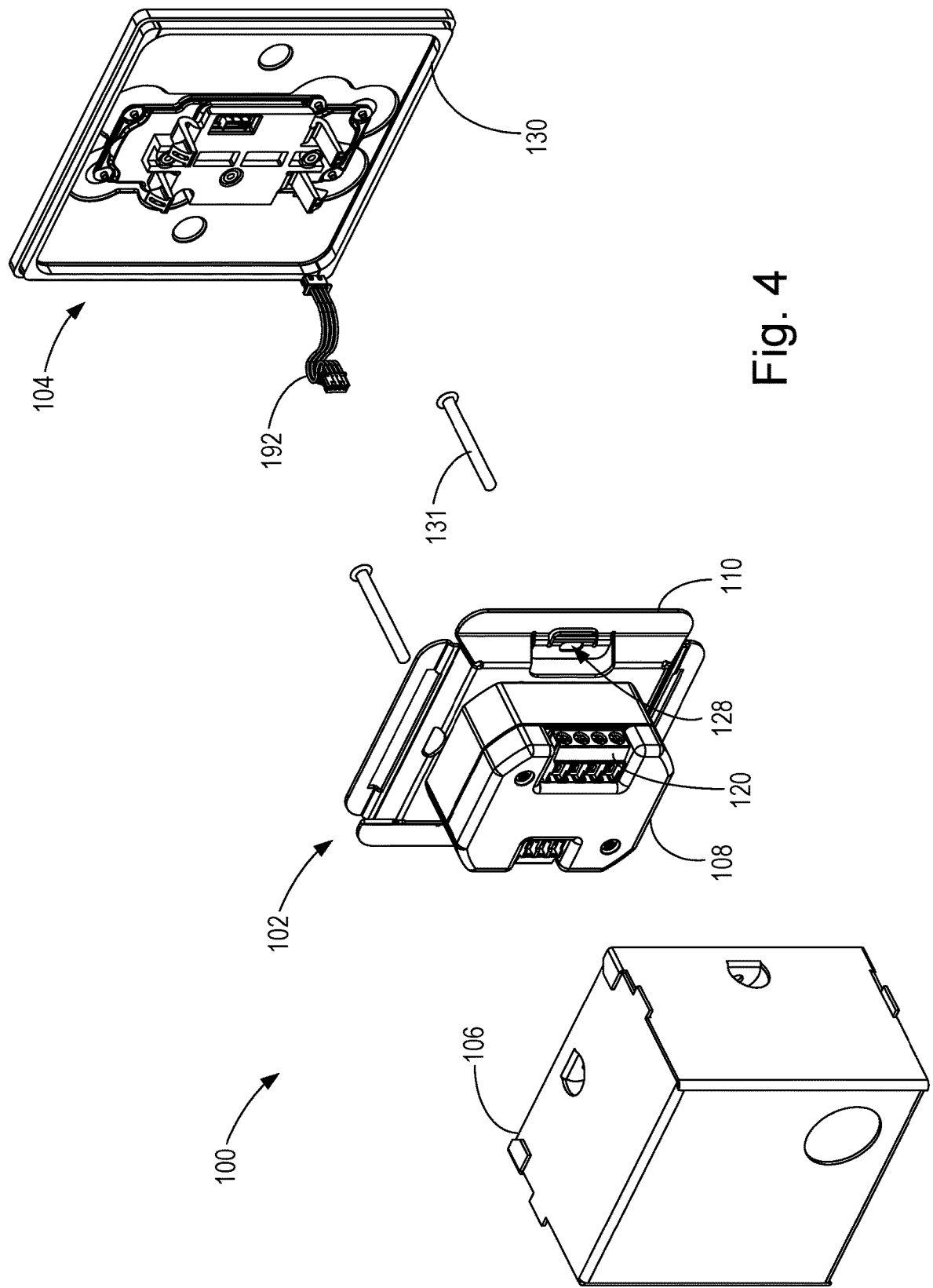
FIG. 4 is an exploded rear perspective view of the control device of FIG. 1 and the wall box.

FIG. 1 is a front perspective view and FIG. 2 is a front view of an example control device (e.g., a wall-mounted keypad 100) for controlling the amount of power delivered to one or more electrical loads (e.g., lighting loads), for example, as part of a load control system. FIGS. 3 and 4 show exploded front and rear perspective views, respectively, of the keypad 100. The keypad 100 may comprise a main control module subassembly 102 and a faceplate subassembly 104. The keypad 100 may be configured to mount to a wall box 106 (e.g., as shown in FIGS. 3 and 4) when installed in a wall of a home or building. As described further herein, the keypad 100 may be capable of mounting to a variety of types of wall boxes, including those found in different territories throughout the world, including circular wall boxes such as those commonly used in Europe.

Figure 5:
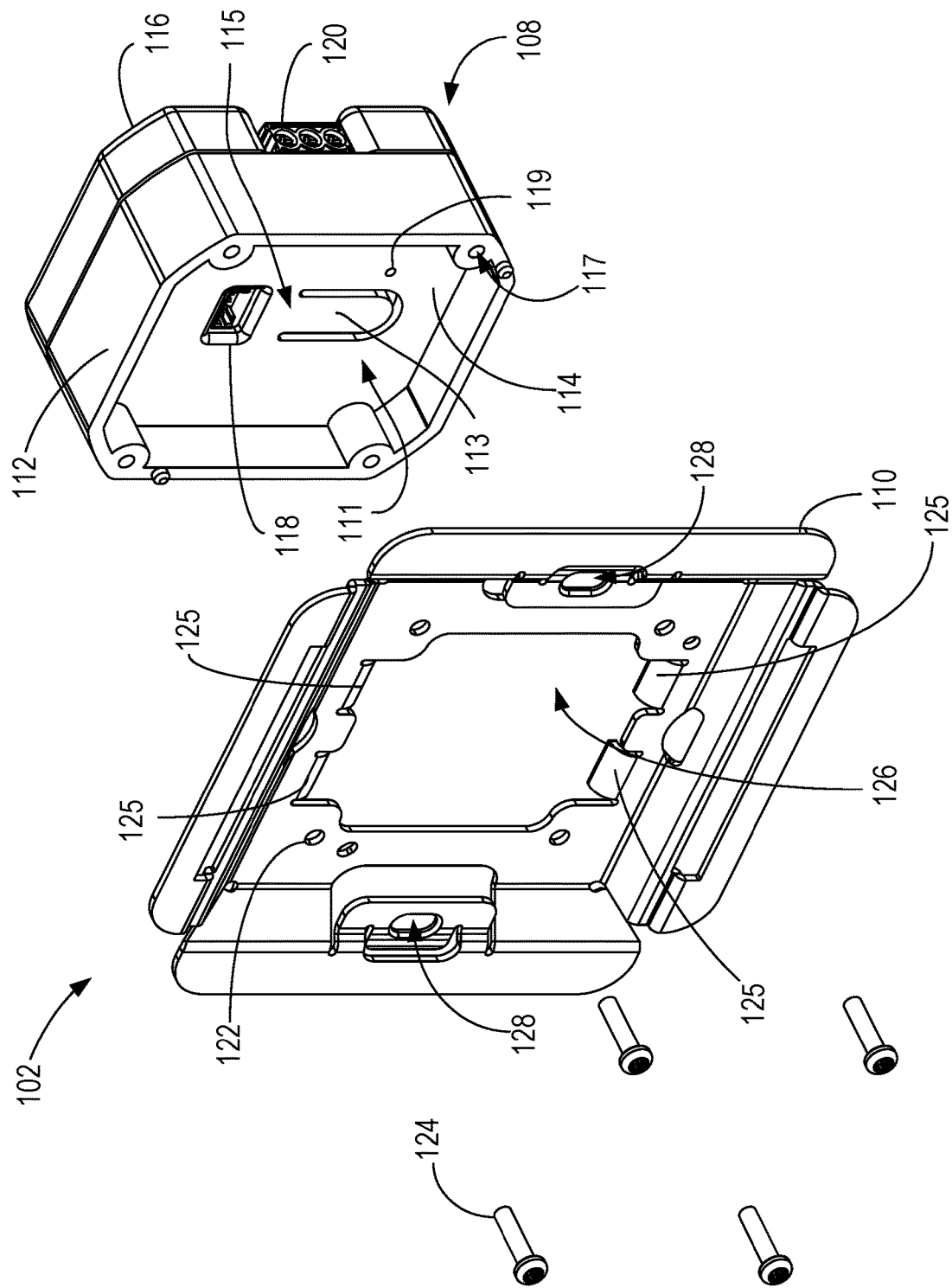
FIG. 5 is an exploded front perspective view of a main control module subassembly of the control device of FIG. 1.
Figure 6:
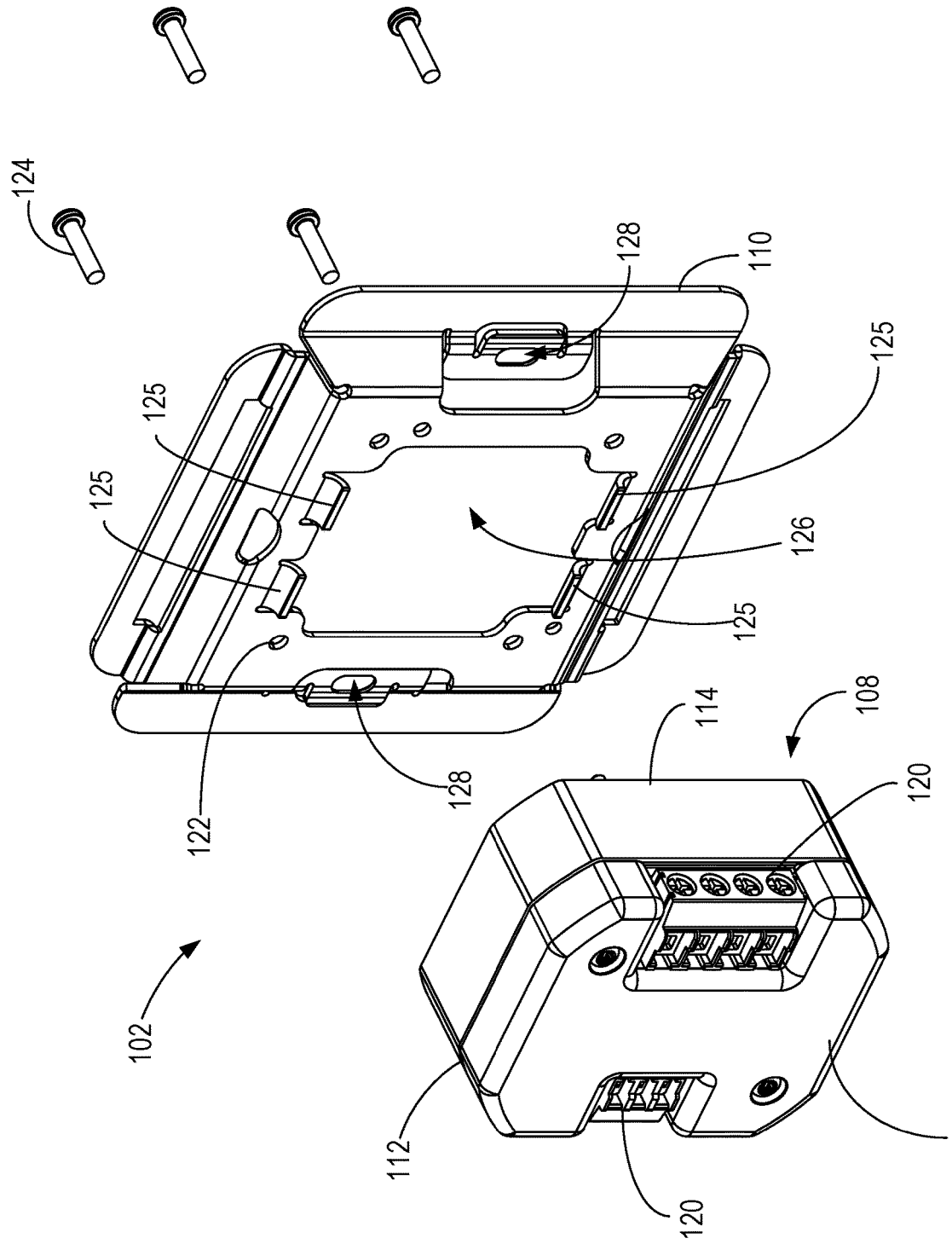
FIG. 6 is an exploded rear perspective view of the main control module subassembly of the control device of FIG. 1.

FIGS. 5 and 6 show exploded front and rear perspective views, respectively, of the main control module subassembly 102. The main control module subassembly 102 may include a main control module 108 and a mounting bracket 110.

The main control module 108 may include at least a portion of the electrical circuitry of the keypad, as will be described in more detail herein. The main control module 108 may comprise an enclosure 112 having a front enclosure portion 114 and a rear enclosure portion 116. As described in more detail herein, the main control module 108 is configured to be attached to the mounting bracket 110. For example, the enclosure 112 may define screw holes 117 for attachment to the mounting bracket 110 via screws 124 as best seen in FIG. 5.

The main control module 108 may include a receptacle 118 (e.g., in the front enclosure portion 114) for receiving a cable connector to electrically connect the main control module 108 to the faceplate subassembly 104, as described further herein. The main control module 108 may also include one or more connectors 120 that may allow the control module to be electrically connected to a power source and/or a wired communication link (e.g., digital communication link and/or an analog control link). The main control module 108 may be configured to receive power via the connectors 120, for example, from an alternating-current (AC) power source and/or a direct-current (DC) power source. The connectors 120 may be positioned at the rear enclosure portion 116.

The mounting bracket 110 may be configured to be attached to the main control module 108 using any appropriate technique. For example, as shown in FIGS. 5 and 6, the mounting bracket 110 may include one or more holes 122 for receiving the screws 124 to couple the mounting bracket 110 to the main control module 108. It should be understood that other forms of attachment can be used to couple the mounting bracket 110 to the main control module 108, such as snaps, flex arms, etc. In other embodiments, the main control module 108 is not positively connected to the mounting bracket 110 and is, instead, able to "float" in the wall box 106 when installed therein.

The mounting bracket 110 may further include a body defining an opening 126 extending through the mounting bracket 110 such that, when the main control module 108 is attached to the mounting bracket 110, the receptacle 118 of the main control module 108 is accessible through the opening 126. As described in more detail herein, this allows the main control module 108 to be electrically connected to the faceplate subassembly 104. One or more flanges 125, which are shown as having a slight curvature away from a front side of the body of the mounting bracket (e.g., away from the surface closest to the faceplate), may extend into opening 126 as best seen in FIGS. 5 and 6. Although four flanges 125 are shown in FIG. 6, it should be understood that fewer or more flanges may be provided. As described herein, the flanges 125 are configured to be engaged by flex arms 186 of attachment member 140 for coupling the faceplate subassembly 104 to mounting bracket 110. The flanges 125 may be curved, angled, or otherwise arranged and suitably dimensioned to facilitate in pulling the faceplate subassembly 104 toward the mounting bracket 110 and into contact with a wall (not shown) when the flanges 125 engage the flex arms 186. In some embodiments, the flex arms 186 may include teeth 188, which may be configured to engage the flanges 125.

The mounting bracket 110 may also include one or more apertures 128, each configured to receive a screw 131 (shown in FIGS. 3 and 4) to mount the main control module subassembly 102 to the wall box 106. The apertures 128 may be slotted (i.e., elongated) to allow for adjustment of the position of the main control module subassembly 102 relative to the wall box 106. For example, the apertures 128 may be elongated in the vertical direction to allow vertical adjustment of the keypad 100 relative to the wall box 106. In various embodiments, the keypad 100 or the wall box 106 may also allow for adjustment of the rotational position of the faceplate 130 (e.g., in the plane of the wall to which the keypad 100 is mounted) to allow the keypad 100 to be aligned as desired. In various embodiments, the wall box 106 may be configured to allow adjustment of the alignment of the faceplate 130 as described in greater detail in commonly-assigned U.S. Patent Application Publication No. 2019/0252137, published Aug. 15, 2019, entitled WALL BOX PROVIDING ADJUSTABLE SUPPORT FOR A CONTROL DEVICE, the entire disclosure of which is hereby incorporated by reference.

Figure 7:
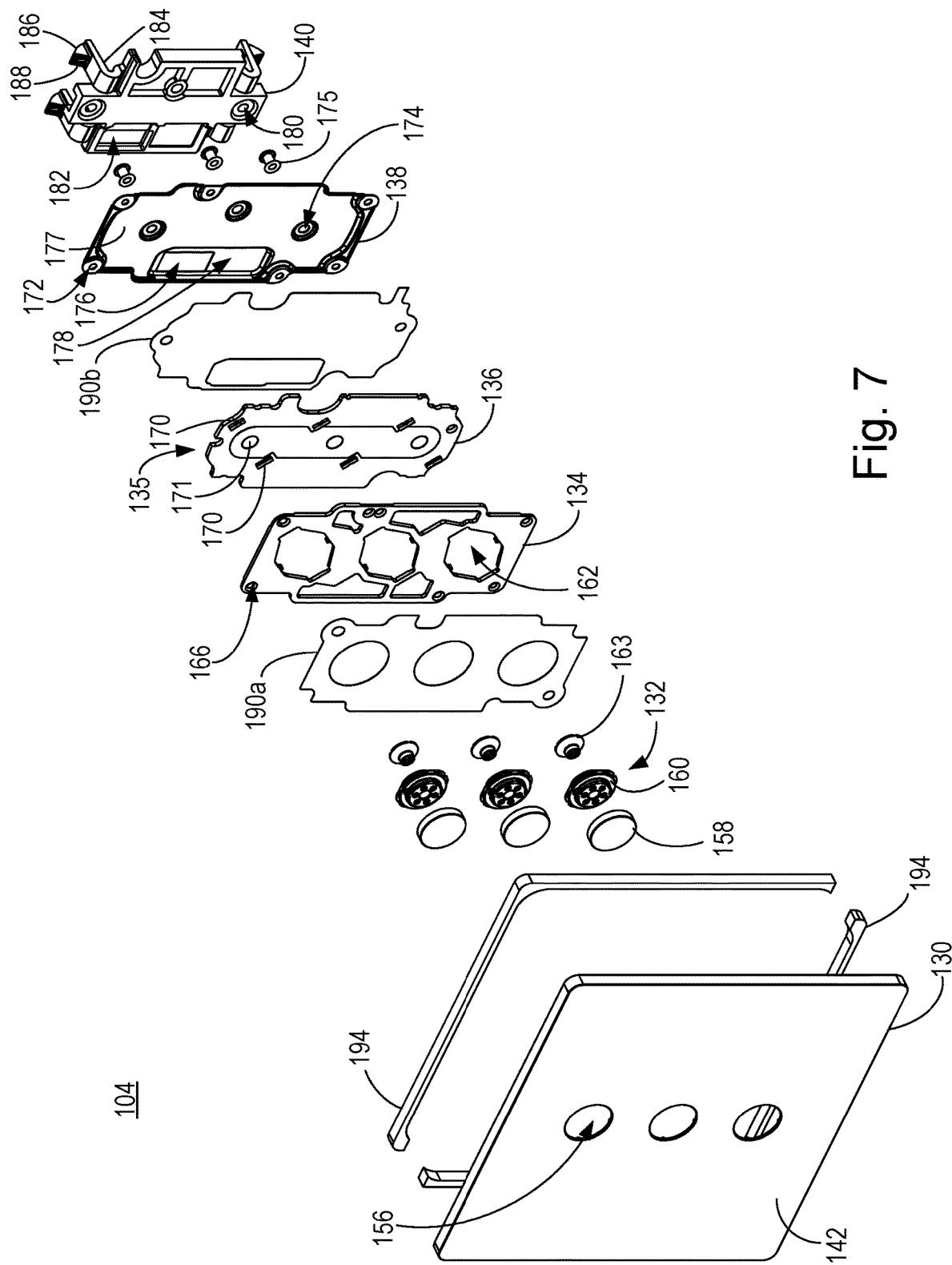
FIG. 7 is an exploded front perspective view of a faceplate subassembly of the control device of FIG. 1.
Figure 8:
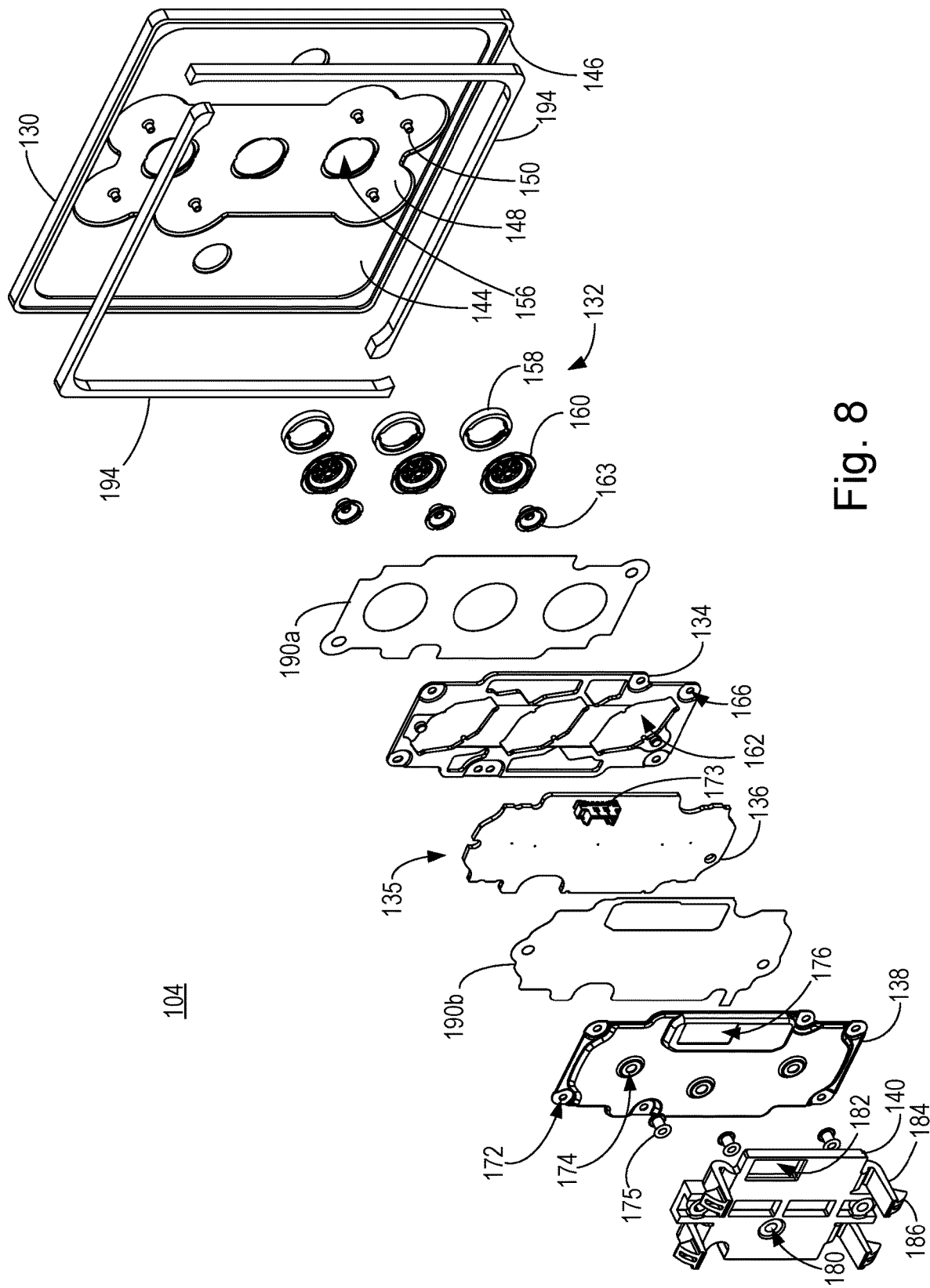
FIG. 8 is an exploded rear perspective view of the faceplate subassembly of the control device of FIG. 1.
Figure 22:
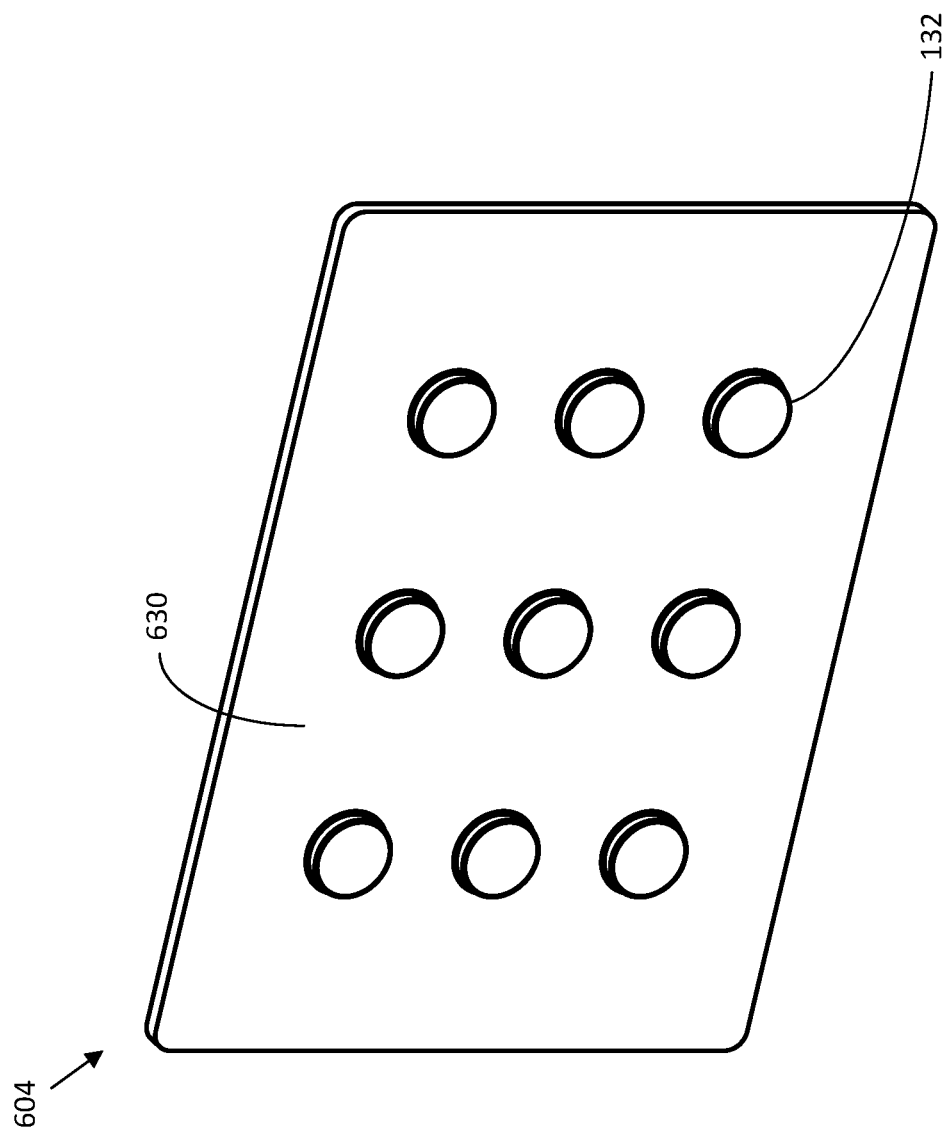
FIG. 22 is a front perspective view of the control device of FIG. 21.
Figure 26:
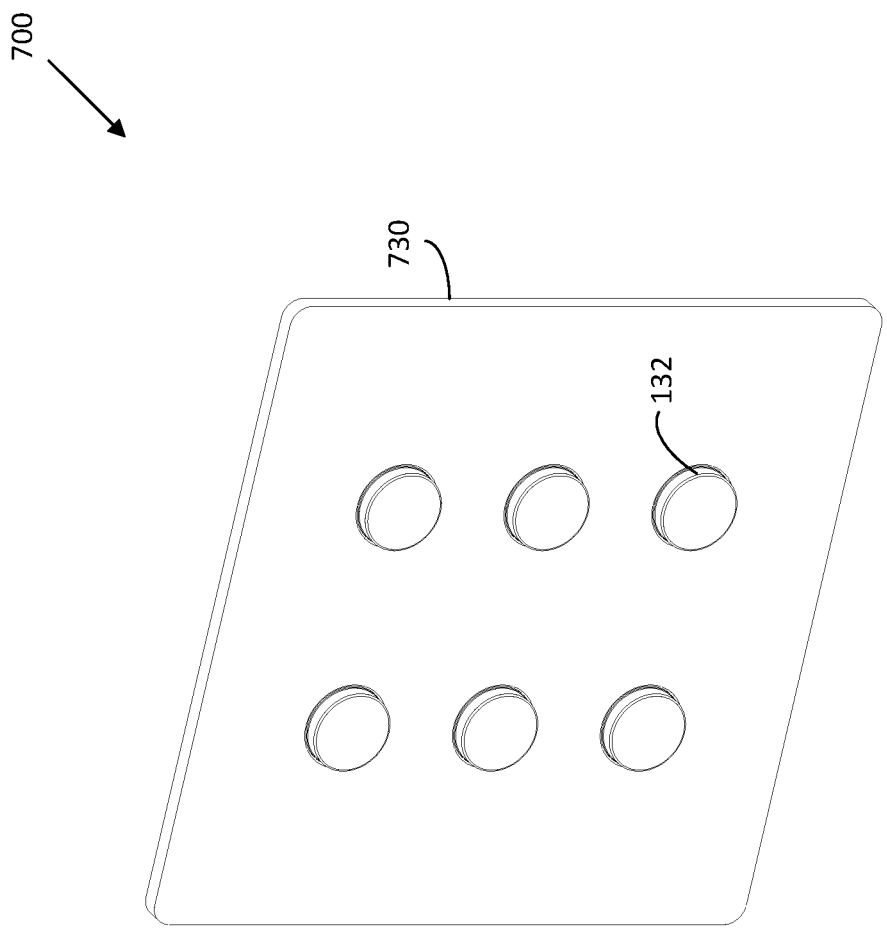
FIG. 26 is a front perspective view of an example control device (e.g., a wall-mounted keypad) for use in a load control system for controlling the amount of power delivered to one or more electrical loads.
Figure 27:
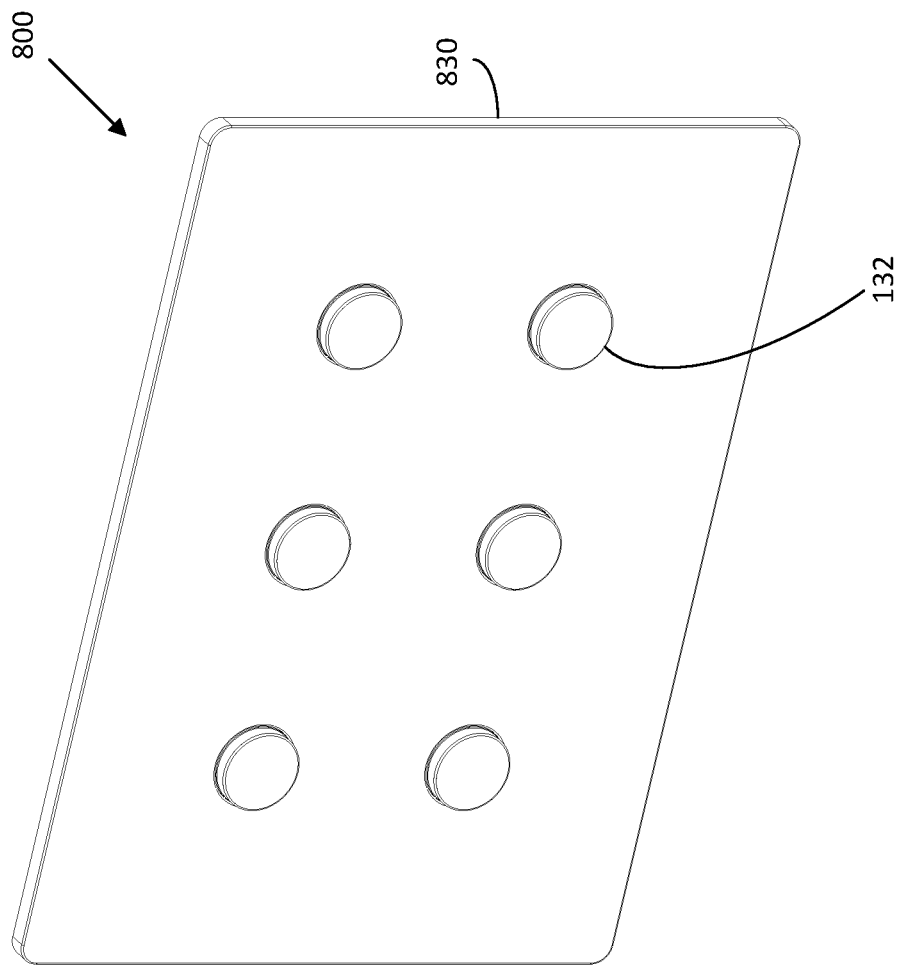
FIG. 27 is a front perspective view of another example of a control device (e.g. a wall-mounted keypad) for use in a load control system for controlling the amount of power delivered to one or more electrical loads.

FIGS. 7 and 8 show exploded front and rear perspective views, respectively, of the faceplate subassembly 104. The faceplate subassembly 104 may include a faceplate 130, one or more buttons 132, a carrier 134, a local control module 135 including a circuit board 136, a back cover 138, and an attachment member 140. The faceplate subassembly 104 may be provided to end users or installers pre-assembled. In various embodiments, as described in more detail herein, portions of the faceplate subassembly 104 are sufficiently thin that the faceplate subassembly 104 can be installed on a wall with a portion of the faceplate subassembly 104 extending beyond the perimeter of the wall box (e.g., wall box 106) to which the keypad 100 is mounted. For example, a distance between a front surface of the faceplate 130 and a rear surface of the back cover 138 may be approximately 0.125 inches and/or in the range of approximately 0.120 to 0.130 inches. In various embodiments, as described further herein, the portion of the faceplate subassembly 104 extending beyond the wall box may include the buttons 132. This provides significant flexibility for providing faceplate assemblies of various sizes with the keypad 100 and allows more buttons 132 to be included on the faceplate subassembly 104 without requiring the installation of larger wall boxes. For example, the faceplate assembly 104 may comprise a single column of buttons 132 (e.g., as shown in FIG. 1) or multiple columns of buttons (e.g., two or three columns of buttons 132 as shown in FIGS. 22, 26 and 27), where the additional buttons may be outside of a perimeter of the wall box opening. The thin design of the faceplate assembly 104 allows for faceplate assemblies having one of more columns of buttons 132, where the spacing of the columns of buttons 132 is independent of the size, shape, or style of the wall box and/or the opening of the wall box in which the keypad is installed.

The faceplate 130 may include a front surface 142 and an opposed rear surface 144. The front surface 142 may be configured to provide a desired aesthetic appearance and may include graining and/or other surface finishes as desired. The faceplate 130 may further include a lip 146 extending outward from the rear surface 144, in the opposite direction from the front surface 142, around the perimeter of the faceplate 130. The rear surface 144 may include a recessed portion 148 that is offset from other portions of the rear surface 144 toward the front surface 142 such that the thickness of the faceplate 130 is less between the front surface 142 and the recessed portion 148 than between the front surface 142 and other portions of the rear surface 144.

Figure 9:
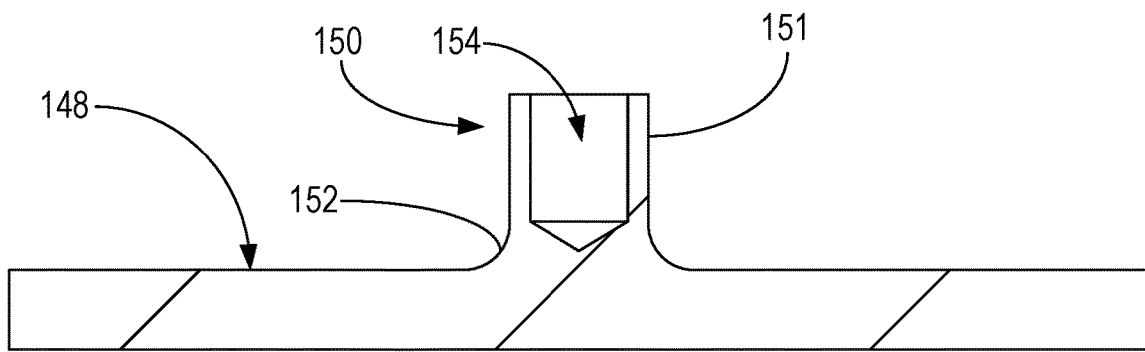
FIG. 9 is a detail cross-sectional view of a portion of a faceplate of the control device of FIG. 1.

The faceplate 130 may further include a plurality of posts 150 extending from the recessed portion 148 of the rear surface 144 in a direction away from the front surface 142. A cross-sectional view of one of the posts 150 is shown in detail in FIG. 9. The posts 150 may have a substantially cylindrical shaft 151 and may also include a fillet 152 at the base of the shaft 151 (e.g., at the interface of the shaft 151 and the recessed portion 148). The posts 150 may include an internal bore 154 extending at least partially into the shaft 151. As described in more detail herein, the posts 150 are used as rivets to couple the carrier 134, the circuit board 136, and the back cover 138 to the faceplate 130. The faceplate 130 may include any appropriate number of posts 150. For example, as illustrated in FIG. 8, the faceplate 130 may include six posts 150. The posts 150 may be positioned in sufficient proximity to the buttons 132 to provide sufficient stiffness for the faceplate subassembly 104 when a button 132 is depressed by a user.

The faceplate 130 may define one or more openings 156 extending through the faceplate 130, from the front surface 142 to the recessed portion 148, and surrounded by a sidewall, within which the buttons 132 are disposed. The faceplate 130 may have indicia on the front surface 142 of the faceplate 130 adjacent to each of the buttons 132 for indicating the command and/or preset that may be selected in response to an actuation of the respective button.

Each of the one or more buttons 132 (e.g., three circular buttons as shown in FIG. 1) may be received through a respective one of the openings 156 of the faceplate 130. In various embodiments, the faceplate 130 and the buttons 132 may have metallic exposed surfaces to provide a desired aesthetic appearance. The sidewall of each opening may be spaced apart from the respective button 132 to form gaps around the buttons.

The buttons 132 may each comprise a cap portion 158 and a diffuser portion 160. The cap portion 158 and the diffuser portion 160 may be coupled together using adhesive, via press-fit, or using any other appropriate means. The cap portion 158 of each button 132 may be opaque. For example, each cap portion 158 may be made of metal. Alternatively, each cap portion 158 may be covered with an opaque material, such as a metallic sheet and/or paint. The cap portion 158 of each button 132 may comprise a sidewall and be received in the respective opening 156 in the faceplate 130 such that the sidewall of the cap portion 158 is spaced apart from the sidewall defining the opening 156. Each cap portion 158 may have a front surface that may be depressed (e.g., pressed in towards the circuit board 136) by a user when the cap portion 158 is received in the respective opening 156.

Figure 11:
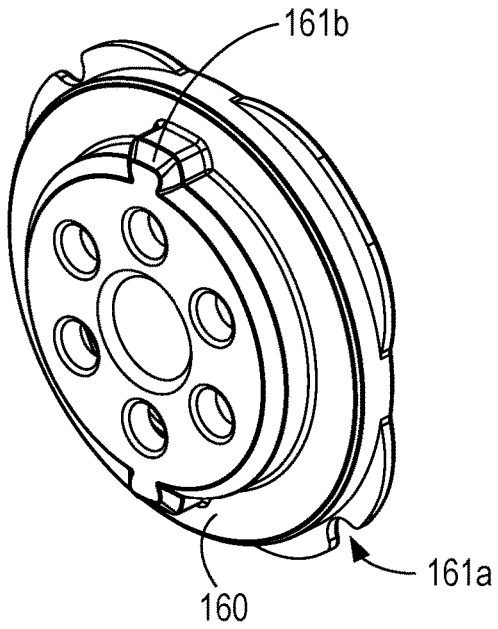
FIG. 11 is a perspective view of the diffuser portion of the buttons of the control device of FIG. 1.

The diffuser portion 160 may have a larger periphery (i.e., outer dimension) than the opening 156. The diffuser portion 160 may be positioned behind and overlap the gap between the respective opening 156 and the cap portion 158 when the cap portion 158 is received in the opening 156. As described in further detail herein, the diffuser portion 160 may conduct light emitted from light source(s) associated with the circuit board 136 to illuminate the gap around the respective button 132. As shown in FIG. 11, the diffuser portion 160 may include notches 161a extending into the periphery of the diffuser portion 160. As described in more detail herein, the notches 161a engage a portion of the carrier 134 to ensure a proper rotational orientation of the button 132. The diffuser portion 160 may further include keys 161b that are configured to engage notches (not shown) in the cap portion 158 to ensure a proper rotational orientation of the cap portion 158 relative to the diffuser portion 160.

As described above, the cap portion 158 of each button 132 may be received in the respective openings 156 of the faceplate 130. When the circuit board 136 is attached to the faceplate 130, the diffuser portions 160 of the buttons 132 may be captured between the faceplate 130 and the circuit board 136.

As shown in FIG. 8, each button 132 may further include a return member 163. Each return member 163 may be configured to bias the corresponding button 132 from a depressed position to the rest position, for example after the button 132 is depressed and pressure is subsequently released from the button 132. The return members 163 may be made of a deflectable, resilient material, such as rubber or the like. As shown, each return member 163 may be in the form of a collapsible, resilient dome. The return members 163 may be configured to collapse when the corresponding button 132 is operated to a depressed position (e.g., by a user applying pressure to the button 132), and to bias the button 132 from the depressed position back to the rest position when operation of the button 132 ceases, for example, after the button 132 is depressed and pressure is subsequently released from the button 132. When the button 132 is pushed in towards the circuit board 136, the return member 163 may be configured to flex and contact the circuit board 136 (e.g., a contact patch 171 on the circuit board 136, shown in FIG. 7), which may short out electrical traces on the circuit board 136 and indicate the depression of the button 132 to a control circuit (described in more detail below with reference to FIG. 12) of the keypad 100. Examples of keypads having switches that include return members in the form of deflectable domes are described in greater detail in commonly-assigned U.S. Pat. No. 10,181,385, issued Jan. 15, 2019, entitled CONTROL DEVICES HAVING INDEPENDENTLY SUSPENDED BUTTONS FOR CONTROLLED ACTUATION, the entire disclosure of which is hereby incorporated by reference. Additionally or alternatively, the switches of the local control module 135 may comprise mechanical tactile switch packages mounted to the circuit board 136 and/or another type of switching mechanism and/or circuit.

Figure 10:
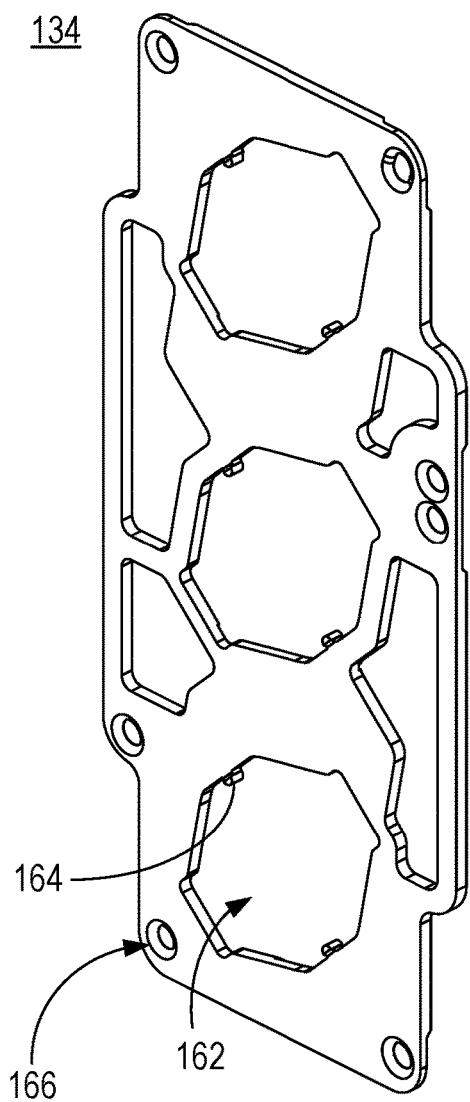
FIG. 10 is a perspective view of the carrier of the control device of FIG. 1.

The carrier 134 may be a relatively flat component with one or more button apertures 162 extending therethrough. At least a portion of each button 132 may extend through a corresponding one of the button apertures 162 to allow the button 132 to contact the circuit board 136. As shown in the detail view of FIG. 10, the carrier 134 may include one or more protrusions 164 extending into the button apertures 162. When the faceplate subassembly 104 is assembled, the protrusions 164 may engage the notches 161 in the diffuser portion 160 of a button 132 to limit rotation of the button 132 with respect to the carrier 134 and, thereby, with respect to the faceplate 130. This may ensure that the buttons 132 are properly aligned with the faceplate 130 so that any graining or patterns on the buttons 132 and the faceplate 130 are aligned as desired. The carrier 134 may include two protrusions 164 extending into each button aperture 162 such that they lie on a common axis. Thus, the button 132 may be positioned in the button aperture 162 in one of two orientations, with the two orientations offset from one another by a rotation of 180°. The carrier 134 may further include a plurality of holes 166 extending therethrough. As described in more detail below, when assembled, each post 150 of the faceplate 130 may pass through a corresponding one of the holes 166 and may be disposed therein to couple the carrier 134 to the faceplate 130. The carrier 134 may be constructed of any appropriate material—such as, for example, nylon.

As noted above, the local control module 135 may include the circuit board 136. The circuit board 136 may be mounted between the carrier 134 and the back cover 138 and be retained in position by the engagement of the posts 150 with the back cover 138. The circuit board 136 may be a printed circuit board and may include traces and other electrical connections and features to allow for the operation of the other components of the local control module 135.

The local control module 135 may further comprise one or more light sources, such as light-emitting diodes (LEDs) 170, mounted to the circuit board 136. For example, the local control module 135 may comprise two LEDs 170 mounted behind each of the buttons 132, for example, on both sides of each contact patch 171 as shown in FIG. 7. The button apertures 162 of the carrier 134 may be sized and dimensioned to allow the LEDs 170 to pass through the button apertures 162 so that the LEDs can illuminate the gap between the corresponding button 132 and the sidewall defining the corresponding opening 156 in the faceplate 130. The diffuser portion 160 of each of the buttons 132 may operate to conduct the light emitted by the LEDs 170 to the gaps surrounding each of the buttons 132.

The local control module 135 may include other components as desired. For example, the local control module 135 may include an ambient light detector, as described in more detail herein. The local control module 135 may include a receptacle 173 (shown in FIG. 8) coupled to the circuit board 136 for electrically connecting the local control module 135 to the main control module 108.

The back cover 138 may be configured to retain the circuit board 136 between the back cover 138 and the carrier 134. The back cover 138 may be constructed such that at least a portion of the perimeter of the back cover 138 lies in a plane that is offset from other portions of the back cover 138, such as a plate 177 shown in FIG. 7. As a result, the back cover 138 forms a pocket within which the circuit board 136 may be disposed when the keypad subassembly 104 is assembled. This position of the circuit board 136 within the pocket may retain the circuit board 136 in position.

The back cover 138 may include a plurality of holes 172 such that, when the faceplate subassembly 104 is assembled, the posts 150 of the faceplate 130 are positioned in a respective one of the plurality of holes 172. The holes 172 may be positioned near the perimeter of the back cover 138. The back cover 138 may further include a plurality of bores 174. As will be described in further detail herein, a rivet 175 (shown in FIG. 8) is positioned through each of the bores 174 to couple the attachment member 140 to the back cover 138.

The back cover 138 may further define a window 176. The window 176 may allow for the passage of wiring or a cable to electrically connect the local control module 135 to the main control module 108. The window 176 may be positioned in a recessed portion 178 of the back cover 138. The recessed portion 178 may provide clearance for components on the circuit board 136.

The attachment member 140 may be coupled to the back cover 138. The attachment member 140 may include bores 180 for receiving rivets 175 to couple the attachment member 140 to the back cover 138. The attachment member 140 may further include a window 182 to allow passage of wires or cables to electrically couple the local control module 135 to the main control module 108. The window 182 in the attachment member 140 may be aligned with the window 176 in the back cover 138 when the faceplate subassembly 104 is assembled. The attachment member 140 may further include one or more flex arms 184, each including a projection 186. The flex arms 184 and projections 186 may be configured to attach the faceplate subassembly 104 to the main control module subassembly 102, as described in further detail herein. In some embodiments, each projection 186 may include a plurality of teeth 188. The teeth 188 may be configured to engage and grip respective flanges 125 of the mounting bracket 110 to couple the faceplate subassembly 104 to the main control module subassembly 102. The teeth 188 may be disposed at different angles (i.e., relative to the longitudinal axis of the flex arm 184) to allow for surface contact of one of the teeth 188 with a face of the mounting bracket 110 regardless of the orientation of the flex arm 184.

The faceplate subassembly 104 may further include one or more insulators 190. For example, as shown in FIGS. 7 and 8, the faceplate subassembly 104 may include a first insulator 190a between the rear surface 144 of the faceplate 130 and the carrier 134. The faceplate subassembly 104 may further include a second insulator 190b between the circuit board 136 and the back cover 138. The insulators 190 may be constructed of any appropriate material that electrically insulates the components of the faceplate subassembly 104 from one another. For example, the insulators 190 may comprise a MELINEX® polyester film.

When assembled, the faceplate subassembly 104 may be arranged in a stack in the following order: (i) the faceplate 130, (ii) the first insulator 190a, (iii) the carrier 134, (iv) the circuit board 136, (v) the second insulator 190b, (vi) the back cover 138, and (vii) the attachment member 140. The posts 150 may extend through the holes 166 in the carrier 134 and the holes 172 in the back cover 138. With these components stacked as noted above and with the posts 150 disposed in the holes 166, 172, the end of the post 150 may be formed (e.g., rolled over or compressed) such that the diameter of the end of the post is increased (e.g., in a mushroom-like shape) to secure the components together. The inclusion of the fillet 152 at the base of the post 150 may increase the area through which force is transmitted from the post 150 to the recessed portion 148 while forming the end of the post 150. This may limit the risk of creating an indent or mark on the front surface 142 of the faceplate 130 to preserve the desired appearance of the faceplate 130. Rolling of the post 150 may flex the back cover 138 to securely retain the circuit board 136 and the carrier 134 in place.

The attachment member 140 may be attached to the back cover 138 before or after the back cover 138 is coupled to the faceplate 130. To couple the attachment member 140 to the back cover 138, the rivets 175 can be inserted through the bores 174 in the back cover 138 and the bores 180 in the attachment member 140. The end of the rivets 175 may then be formed to secure the attachment member 140 to the back cover 138. It should be understood that other methods and means may be used to couple the attachment member 140 to the back cover 138—such as, for example, screws, adhesive, snap arms, heat stakes, etc.

Assembling the components of the faceplate subassembly 104 in this way may allow the stack (i.e., thickness) from the front surface 142 of the faceplate 130 to the back cover 138 to be quite thin. This is particularly so as these components may be positioned against the recessed portion 148 of the rear surface 144 of the faceplate 130. In some embodiments, when assembled, the distance from the front surface 142 of the faceplate 130 to the plate 177 of the back cover 138 may be less than the depth of the lip 146 of the faceplate 130. This may allow a portion of the faceplate subassembly 104 to be positioned outside the perimeter of the wall box 106. In other words, for example, a portion of the back cover 138 may be disposed between the faceplate 130 and drywall or other building material that is adjacent to the cutout in the building material for the wall box. This may allow the faceplate subassembly 104 to include multiple arrays (or gangs) of buttons and still be mounted to a wall box that was designed for a single gang switch. This may allow for significant advantages in terms of flexibility in designing load control systems without modifying wall boxes or other structures. It should be understood that, when the faceplate subassembly 104 includes multiple arrays (or gangs) of buttons, each array of buttons may be associated with a separate carrier, local control module, and back plate, but that the faceplate subassembly 104 may still only require a single attachment member to attach the faceplate subassembly 104 to the main control module subassembly 102. Further, in such embodiments, each local control module may be connected to the main control module via a separate cable.

As shown in FIGS. 3 and 4, the keypad 100 may further include a cable 192 to electrically connect the main control module 108 and the local control module 135. As described in further detail herein, the electrical connection of the main control module 108 and the local control module 135 allows the main control module 108 to control an electrical load based on depression of one or more of the buttons 132. The cable 192 may include any appropriate type of end connectors to connect to the receptacle 118 of the main control module 108 and the receptacle 173 of the local control module 135.

During installation of the keypad 100, one or more wires may be connected to the connector 120 of the main control module 108 to electrically connect the keypad 100 to the wired communication link, as well as a power source and/or one or more loads in a home or building. The main control module subassembly 102 may then be attached to the wall box 106 by inserting the screws 131 through the apertures 128 in the mounting bracket 110. The screws 131 may be threaded into threaded holes in the wall box 106. The cable 192 may then be attached to the main control module 108 and the local control module 135. The faceplate subassembly 104 may then be coupled to the mounting bracket 110 by engaging the flex arms 184 of the attachment member 140 with the mounting bracket 110. More specifically, the flex arms 184 of the attachment member 140 may engage respective flanges 125 of the mounting bracket 110 that extend inwardly into opening 126 of the mounting bracket to pull the faceplate subassembly 104 toward the mounting bracket 110. The flex arms 184 may be flexed as the projections 186 are brought into contact with the flanges 125. Once the projections 186 clear the flanges, then the flex arms 184 may flex back to their normal orientation thereby securing the faceplate subassembly 104 to the mounting bracket 110. As noted above, the flex arms 184 and flanges 125 are dimensioned such that the faceplate subassembly 104 is pulled toward the mounting bracket 110 (and thus the wall) when the faceplate subassembly 104 and mounting bracket are engaged. The arms 184 may stay flexed once engaged with the bracket 110, as the projections 186 may not pass the flanges of the bracket 110 thereby preventing the arms 184 from relaxing. In some embodiments, the projections 186 may include teeth 188, which may be configured to engage the bracket 110 while the arms are either flexed or relaxed.

As shown in FIGS. 7 and 8, the faceplate subassembly 104 may include one or more gaskets 194 coupled to the rear surface 144 of the faceplate 130 just inside the lip 146. The gaskets 194 may be constructed of an elastomeric or other compressible material. When the keypad 100 is installed, the gaskets 194 may come into contact with the wall to which the faceplate 130 is mounted to take up any gaps that may exist between the lip 146 of the faceplate 130 and the wall.

In response to an actuation of one or more of the buttons 132, the keypad 100 may be configured to cause the electrical loads to be controlled, for example, to turn the electrical loads on and off and/or the adjust the amount of power delivered to the electrical loads (e.g., dimming control). For example, the keypad 100 may transmit a digital message to one or more external load control devices (e.g., dimmers, light-emitting diode drivers, motorized window treatments, thermostats, system controllers, etc.) via a communication link for controlling respective electrical loads in response to an actuation of one of the buttons 132. The communication link may comprise a wired communication link or a wireless communication link, such as a radio-frequency (RF) communication link. Alternatively or additionally, the keypad 100 may comprise an internal load control circuit for controlling the power delivered to one or more electrical loads (e.g., electrically coupled to the keypad), and may be configured to control the internal load control circuit in response to an actuation of one of the buttons. Examples of load control systems having remote control devices, such as the keypad 100, are described in greater detail in commonly-assigned U.S. Pat. No. 6,803,728, issued Oct. 12, 2004, entitled SYSTEM FOR CONTROL OF DEVICES, and U.S. Pat. No. 9,553,451, issued Jan. 24, 2017, entitled LOAD CONTROL SYSTEM HAVING INDEPENDENTLY-CONTROLLED UNITS RESPONSIVE TO A BROADCAST CONTROLLER, the entire disclosures of which are hereby incorporated by reference.

Actuations of the buttons 132 may cause the keypad 100 to control the electrical loads according to respective commands (e.g., predetermined and/or preprogrammed commands). The keypad 100 may, for example, transmit a message including an indication of the button 132 that was pressed and/or a command for controlling the electrical loads via the wired communication link coupled to the connectors 120. For example, the buttons 132 of the keypad 100 may comprise an on button for turning on the electrical load, an off button for turning off the electrical load, a raise button for increasing the amount of power delivered to the electrical load, and/or a lower button for decreasing the amount of power delivered to the electrical load. Additionally or alternatively, actuations of the one or more of the buttons 132 may recall respective presets (e.g., predetermined and/or preprogrammed presets or scenes), which may cause one or more electrical loads to be controlled to different power levels as set by the presets. The buttons 132 may each comprise indicia (not shown), such as text or icons, for indicating the command and/or preset that may be selected in response to an actuation of the respective button. Additionally or alternatively, the faceplate 130 may have indicia on the front surface 142 of the faceplate adjacent to each of the buttons 132 for indicating the command and/or preset that may be selected in response to an actuation of the respective button.

The keypad 100 may be configured to illuminate an area around each of the buttons 132, for example, by illuminating the gap around each of the buttons 132. For example, the keypad 100 may be configured to illuminate the gaps to provide feedback to a user. The keypad 100 may be configured to illuminate the gap around one of the buttons 132 (e.g., by blinking and/or strobing the illumination) when that button is actuated (e.g., to indicate that the command has been received and/or the keypad 100 is transmitting a message to external load control devices). The keypad 100 may be configured to illuminate the gap around one of the buttons 132 to indicate the status of one or more associated electrical loads (e.g., status information regarding whether the electrical loads are on or off). The keypad 100 may be configured to illuminate the gap around one of the buttons 132 to indicate the selection of a respective preset associated with the button. For example, the keypad 100 may be configured to illuminate the gap around the button 132 of the selected preset to a first intensity level and to illuminate the gaps around each of the other buttons to a second intensity level that may be less than the first intensity level. The keypad 100 may be configured to illuminate the gaps around one or more of the buttons 132 (e.g., solidly illuminate, blink, or strobe) for an amount of time after an actuation of the button and then turn off the illumination. In addition, the keypad 100 may be configured to illuminate the gaps (e.g., to a dim level) to provide a nightlight feature, so that the keypad may be located in a dark environment. In various embodiments, the buttons may be configured as described in greater detail in commonly-assigned U.S. Patent Application Publication No. 2019/0230762, published Jul. 25, 2019, entitled KEYPAD HAVING ILLUMINATED BUTTONS, the entire disclosure of which is hereby incorporated by reference.

While the keypad 100 shown in FIGS. 1-11 and described herein has circular buttons 132 and circular openings 156 in the faceplate 130, the buttons and the openings may have different shapes, sizes, and depths. In addition, the faceplate 130 may have a different shape, size, and/or thickness. For example, in other embodiments, the keypad 100 may have square buttons received in square openings of a square faceplate. The buttons, the openings, and the faceplates, may also have other shapes, such as rectangle, triangle, oval, and/or ellipse shapes.

As described above, the main control module 108 is electrically connected to the circuit board 136. This allows the processing and control tasks of the keypad 100 to be shared between the main control module 108 and the local control module 135 as desired. For example, and as described in more detail below, the load control functions may be performed by the main control module 108. As a result, the local control module 135 may be a relatively simple and cost effective component. The local control module 135 may be configured, primarily, to relay a signal to the main control module 108 upon depression or actuation of one of the buttons 132. The circuit board 136 may be further configured to control the illumination of the gaps around the buttons—for example, via the LEDs 170. The control of the illumination of the gaps around the buttons 132 may be based on determinations made locally at the local control module 135 or, alternatively, may be in response to a control signal provided by the main control module 108.

The keypad 100 may be configured such that the main control module subassembly 102 may be installed (e.g., mounted to the wall box 106), powered, and operated prior to the faceplate subassembly 104 being installed (e.g., mechanically connected to the electrically connected to the mounting bracket 110 and/or electrically connected to the main control module 108 via the cable 192). After installation of the main control module subassembly 102, construction of the surround building may still be ongoing. If the faceplate subassembly 104 is installed on the main control module subassembly 102 while construction is still ongoing, the surfaces (e.g., the metallic surfaces) of the faceplate 130 and the buttons 132 may become dirty and/or damaged. Therefore, the faceplate subassembly 104 may be installed on the main control module subassembly 102 after construction of the building and/or the area surrounding the keypad 100 is complete and/or nearly complete. However, control of the electrical load controlled by the main control module subassembly 102 may be desired prior to installation of the faceplate subassembly 104.

The main control module 108 may comprise an actuator 111 (e.g., a button) that may be actuated to control the electrical load controlled by the main control module subassembly 102. In response to an actuation of the actuator 111, the main control module 108 may be configured to, for example, transmit a message including an indication that the actuator 111 was pressed and/or a command for controlling the electrical loads via the wired communication link coupled to the connectors 120. For example, the actuator 111 may comprise an elongated lever 113 connected to the front enclosure portion 114 of the main control module 108 at a junction 115. When the actuator 111 is pressed in towards the main control module 108, the lever 113 may pivot about the junction 115 and actuate a momentary switch (not shown) inside of the main control module 108. The main control module subassembly 102 may be configured to turn the electrical load on and off in response to consecutive actuations of the actuator 111. In addition, another control device in the load control system may be configured to control the electrical loads according to predetermined programming data in response to receiving a message indicating that the actuator 111 was actuated from the main control module 108. The predetermined programming data may be configured by a configuration device in the load control system, such that the manner in which the electrical loads are controlled in response to actuations of the actuator 111 may be modified (e.g., to provide alternate control than simply turning the electrical loads on and off). Further, the main control module subassembly 102 may be configured to enter a configuration mode and/or otherwise be configured in response to actuations of the actuator 111.

The main control module 108 may also comprise a visible indicator 119, which may be illuminated to provide feedback to a user of the main control module 108. For example, the visible indicator 119 may comprise an opening in the front enclosure portion 114 of the main control module 108 that may be illuminated by a light source (e.g., an LED—not shown) inside of the main control module 108. The main control module 108 may be configured to illuminate the visible indicator 119 to indicate a status of the main control module 108. The main control module 108 may be configured to turn the visible indicator 118 on or off, blink the visible indicator 119, and/or illuminate the visible indicator 119 one or more different colors to indicate the status. For example, the visible indicator 119 may be illuminated green when the main control module 108 is operating correctly and red when the main control module 108 has determined that there is an error condition.

When the faceplate assembly 104 is not installed on the main control module assembly 108 during construction of the surrounding building, a temporary faceplate may be installed on the main control module assembly 102. FIG. 12 is a front perspective view showing an example temporary faceplate 400, the main control module assembly 102, and the wall box 106. FIG. 13 is a rear perspective view showing a rear surface 310 of the temporary faceplate 400. The temporary faceplate 400 may comprise a rim 412 that surrounds the rear surface 410 and may contact the wall (e.g., in which the wall box 106 is mounted) when the temporary faceplate 400 is attached to the main control module assembly 102. The temporary faceplate 400 may be installed on the main control module assembly 102 as additional protection during construction of the building (e.g., to prevent the main control unit 108 from getting dirty and/or damaged). In addition, the temporary faceplate 400 may have similar dimensions to the faceplate 130 of the faceplate assembly 104 that will be installed on the keypad 300 after construction is completed, such that construction may continue around the keypad unhindered (e.g., painting, application of joint compound, etc.).

The temporary faceplate 400 may comprise one or more flex arms 414 extending from the rear surface 410. The flex arms 414 may be similar to the flex arms 184 on the attachment portion 140 of the faceplate assembly 104. Each flex arm 414 may comprise a projection 416. The flex arms 414 and the projections 416 may be configured to attach the temporary faceplate 400 to the main control module subassembly 102. Each projection 416 may include a plurality of teeth 418. The teeth 418 may be configured to engage and grip the flanges 125 of mounting bracket 110 to couple the faceplate subassembly 104 to the main control module subassembly 102.

The temporary faceplate 400 may also comprise an actuator 420 (e.g., a button) that may be actuated to control the electrical load when the temporary faceplate 400 is installed on the main control module assembly 102. The actuator 420 may comprise an elongated lever 422 connected to the temporary faceplate 400 at a junction 424. The actuator 420 may also comprise a post 426 extending from a rear surface 410 of the lever 422 as shown in FIG. 13. When the actuator 420 is pressed in towards the main control module 108, the lever 422 may pivot about the junction 424 and the post 426 may actuate the actuator 111 of the main control module 108. The temporary faceplate 400 may also comprise an opening 428 through which the visual indicator 119 of the main control module 108 may be seen.

After construction of the building or the area of the building surrounding the wall box 106 (e.g., in which main control module assembly 102 is installed) is complete, the temporary faceplate 400 may be removed and the faceplate assembly 104 may be installed on the main control module assembly 102 (e.g., as shown in FIG. 3). The cable 192 may be attached to the main control module 108 and the local control module 135, and the faceplate subassembly 104 may then be coupled to the mounting bracket 110. When the faceplate assembly 104 is installed on the main control module assembly 102 (e.g., when the cable 192 is attached to the main control module 108 and the local control module 135), the main control module 108 may be configured to adjust its operation. For example, the main control module 108 may be configured to disable the operation of the actuator 111, such that the actuator may not be unintentionally actuated (e.g., by the cable 192) after the faceplate assembly 104 is installed. In addition, the main control module 108 may be configured to disable the visible indicator 119. The main control module 108 may also be configured to enable (e.g., re-enable) the operation of the actuator 111 and the visible indicator 119 when the faceplate assembly 104 is removed from the main control module assembly 102.

Figure 14:
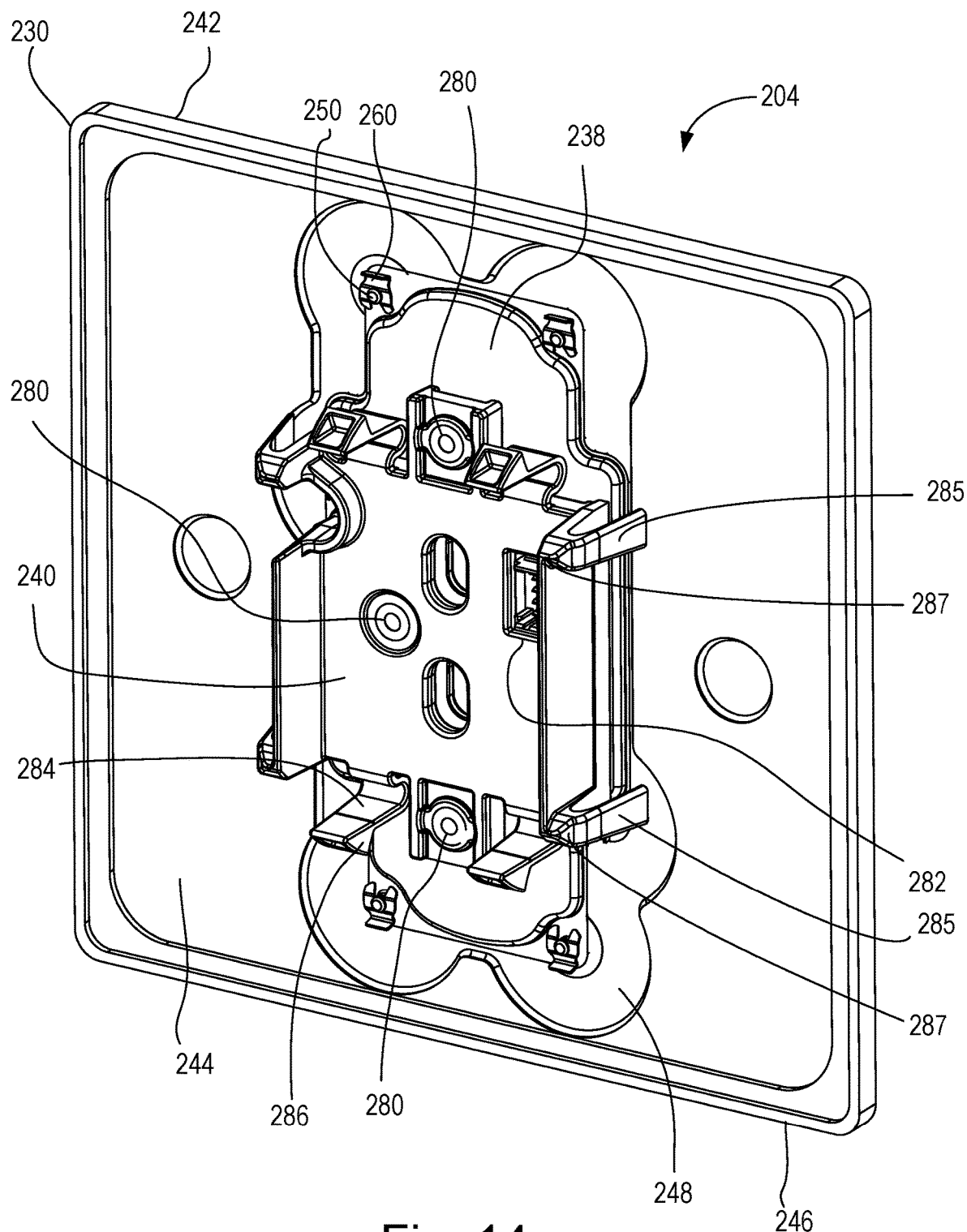
FIG. 14 is a rear perspective view of an example faceplate subassembly of a control device (e.g., a wall-mounted keypad) for controlling the amount of power delivered to one or more electrical loads (e.g., lighting loads), for example, as part of a load control system.
Figure 15:
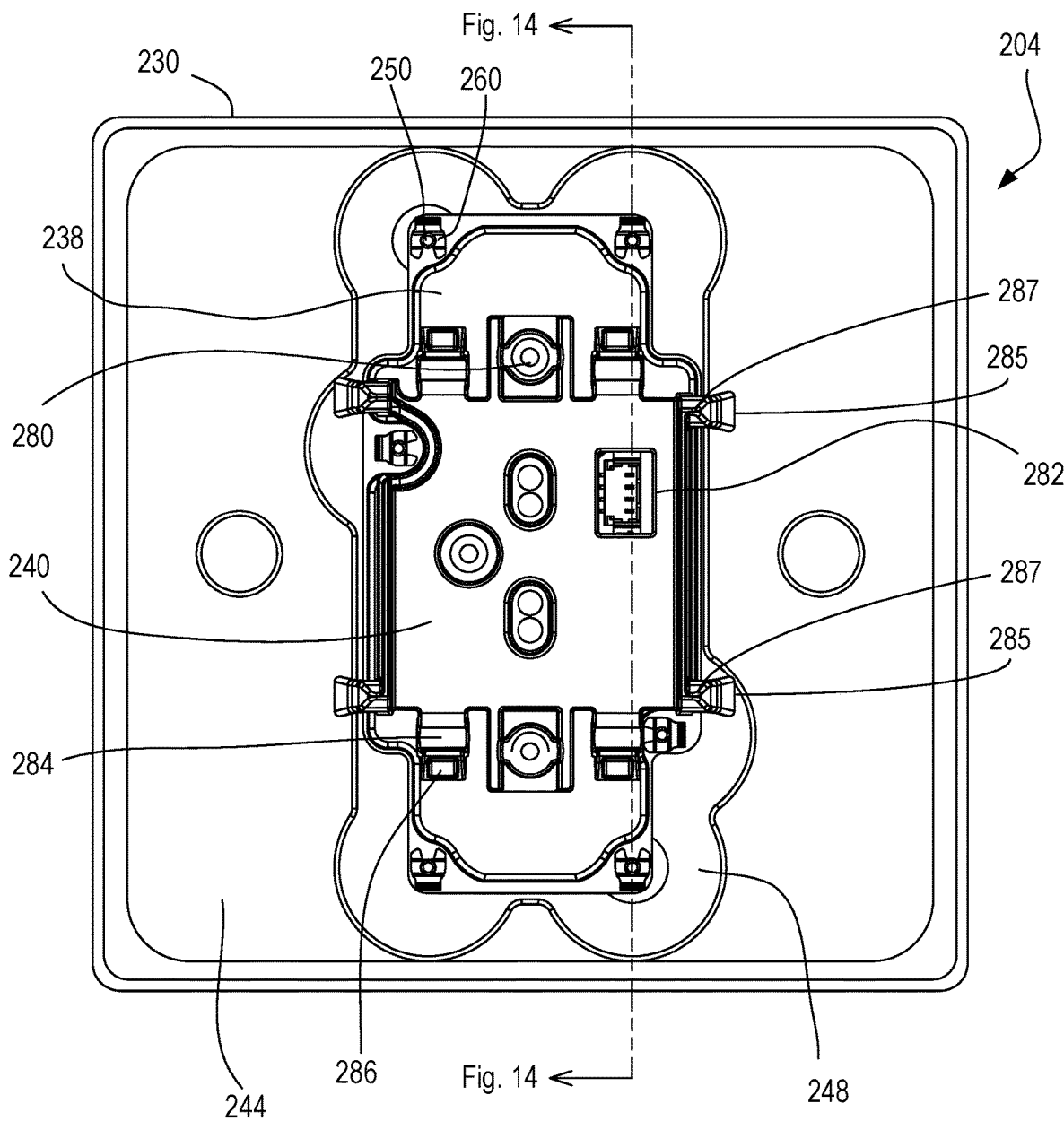
FIG. 15 is a rear view of the faceplate subassembly of FIG. 14.

FIG. 14 is a rear perspective view and FIG. 15 is a rear view of another example faceplate subassembly 204 of a control device (e.g., the wall-mounted keypad 100) for controlling the amount of power delivered to one or more electrical loads (e.g., lighting loads), for example, as part of a load control system. The faceplate subassembly 204 may be configured to be attached to a main control module assembly (e.g., the main control module assembly 102) of the control device. The main control module assembly of the control device may be configured to mount to a wall box (e.g., the wall box 106) when installed in a home or building, for example, in a similar manner as the keypad 100 mounts to the wall box 106 (e.g., as shown in FIGS. 3 and 4).

The faceplate subassembly 204 may have a similar structure as the faceplate subassembly 104 (e.g., as shown in FIGS. 7 and 8). The faceplate subassembly 204 may include a faceplate 230, a back cover 238, and an attachment member 240 (e.g., similar to the faceplate 130, the back cover 138, and the attachment member 140, respectively, of the faceplate subassembly 104). In addition, the faceplate subassembly 204 may comprise one or more buttons (e.g., such as the buttons 132), a carrier (e.g., such as the carrier 134), and a local control module (e.g., such as the local control module 135). The faceplate 230, the buttons, the carrier, the local control module, the back cover 238, and the attachment member 240 may be assembled together in a similar manner as the faceplate subassembly 104 (e.g., as shown in FIGS. 7 and 8). The buttons, the carrier, and the local control module may be captured between the faceplate 230 and the back cover 238 (e.g., in a similar manner as with the faceplate subassembly 104). Optionally, the faceplate subassembly 204 may comprise one or more insulators (e.g., the insulators 190). As described in more detail herein, portions of the faceplate subassembly 204 are sufficiently thin that the faceplate subassembly 204 can be installed on a wall with a portion of the faceplate subassembly 204 extending beyond the perimeter of the wall box to which the control device is mounted (e.g., as with the faceplate subassembly 104 of the keypad 100).

The faceplate 230 may include a front surface 242 and an opposed rear surface 244 (e.g., similar to the front surface 142 and the opposed surface 144, respectively, of the faceplate 130). The front surface 242 may be configured to provide a desired aesthetic appearance and may include graining and/or other surface finishes as desired. The faceplate 230 may further include a lip 246 extending outward from the rear surface 244, in the opposite direction from the front surface 242, around the perimeter of the faceplate 230. The rear surface 244 may include a recessed portion 248 that is offset from other portions of the rear surface 244 toward the front surface 242 such that the thickness of the faceplate 230 is less between the front surface 242 and the recessed portion 248 than between the front surface 242 and other portions of the rear surface 244.

The attachment member 240 may be coupled to the back cover 238. The attachment member 240 may include bores 280 (e.g., similar to bores 140) for receiving rivets (e.g., such as the rivets 175) to couple the attachment member 240 to the back cover 238 as similarly described for faceplate subassembly 104. The attachment member 240 may include a window 282 (e.g., similar to window 182) and the back cover 128 may include a corresponding window (e.g., similar to window 176) to allow passage of wires or cables (e.g., the cable 192) to electrically couple the local control module to the main control module. The attachment member 240 may further include one or more flex arms 284, each including a projection 286. The flex arms 284 and projections 286 may be configured to attach the faceplate subassembly 204 to the main control module subassembly (e.g., in a similar manner as the flex arms 184 and the projections 186 attach the faceplate subassembly 104 to the main control module subassembly 102). In some embodiments, each projection 286 may include a plurality of teeth (e.g., the teeth 288) configured to engage and grip the mounting bracket (e.g., mounting bracket 110) to couple the faceplate subassembly 204 to the main control module subassembly as similarly described above. Attachment member 240 may also include one or more towers 285, as best seen in FIGS. 14 and 15. The towers 285 extend from surface of the attachment member (e.g., a surface of the body of the attachment member) and may taper along their lengths such that the towers 285 are wider at their base, e.g., adjacent to the back cover 238/rear surface 244 of faceplate 230, than they are at their terminal end 287. The towers 285 may be configured to align the faceplate subassembly 204 relative to a mounting bracket by being received in recesses or channels defined by the mounting bracket as described herein.

Figure 16:
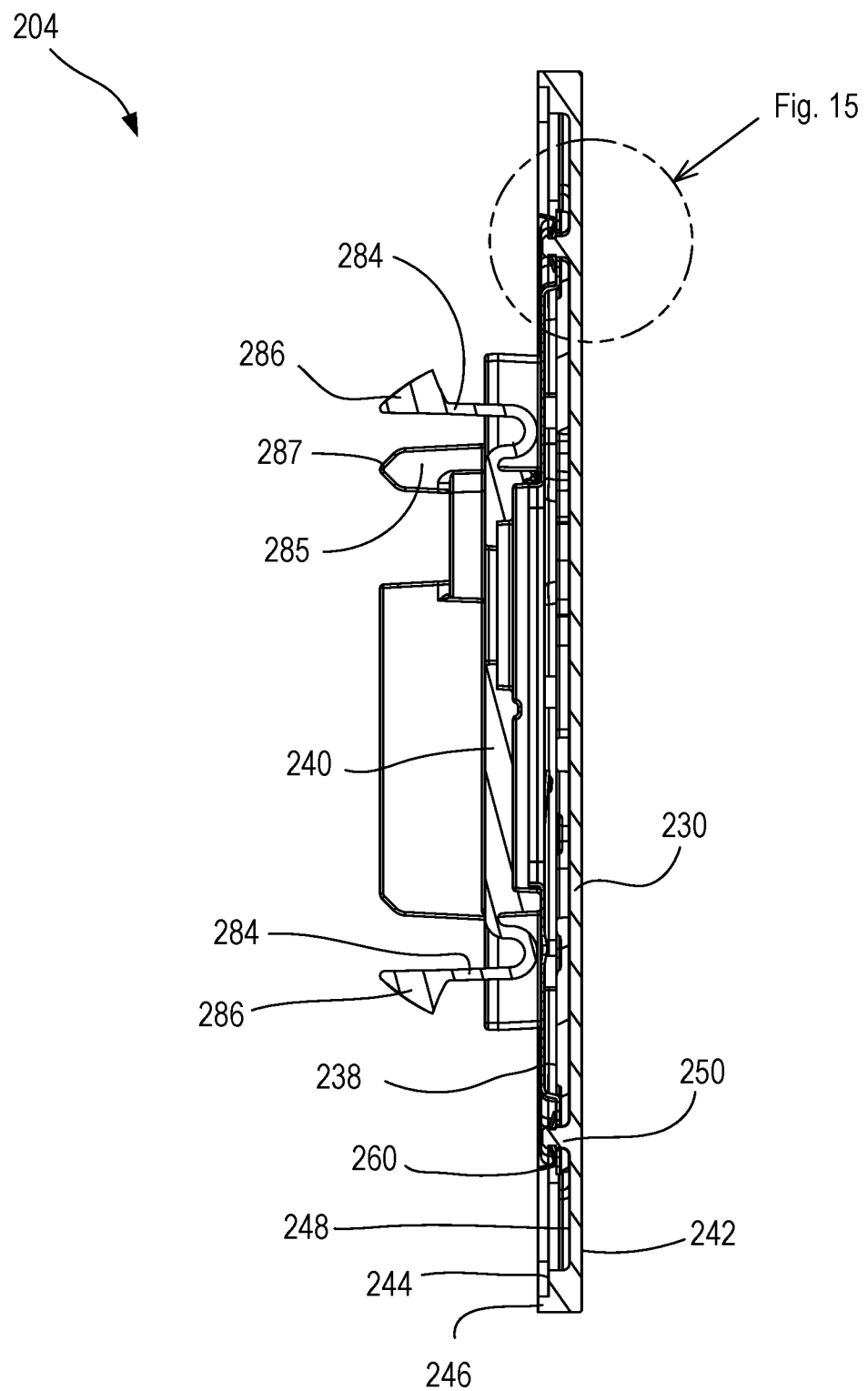
FIG. 16 is a left side cross-sectional view of the faceplate subassembly of FIG. 14 taken through the centers of two posts.
Figure 17:
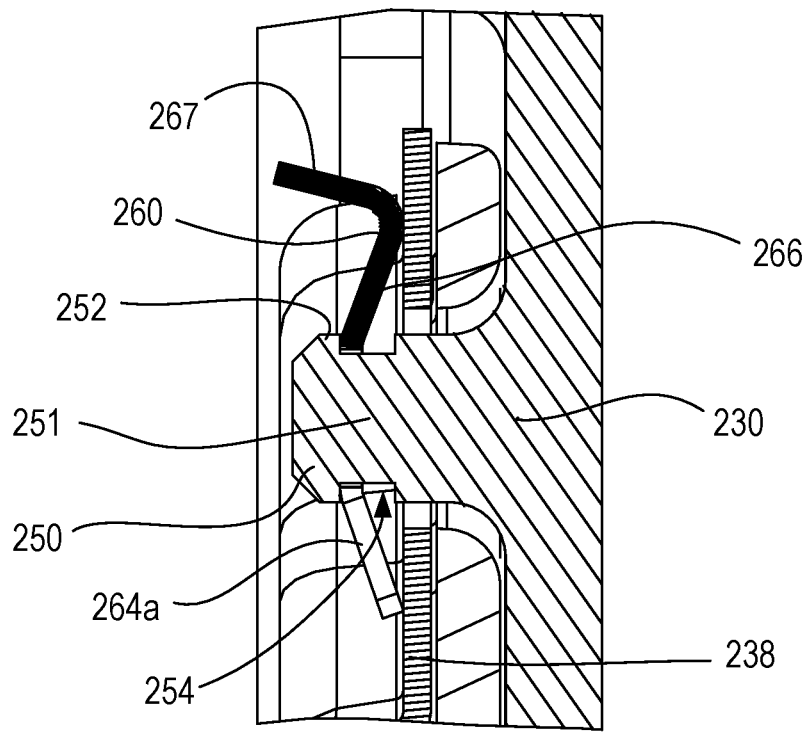
FIG. 17 is a partial enlarged view of the cross-sectional view of FIG. 16.

The faceplate 230 may further include a plurality of posts 250 extending from the recessed portion 248 of the rear surface 244 in a direction away from the front surface 242. FIG. 16 is a left-side cross-sectional view of the faceplate subassembly 204 taken through the centers of two of the posts 250 (e.g., through the line shown in FIG. 15). FIG. 17 is a partial enlarged view of left side cross-sectional view of FIG. 16 showing the upper one of the two posts 250. The posts 250 may each have a substantially cylindrical shaft 251 that is connected to the rear surface 244 of the faceplate 230 and extends along a longitudinal axis away from the rear surface 244 of the faceplate 230. The posts 250 may each also include a flange portion 252 at the end of the shaft 251 (e.g., at the opposing end of the shaft 251 to the end connected to the rear surface 244 of the faceplate 230). The flange portion 252 may be characterized by a diameter that is larger than a diameter of the shaft 251. The shaft 251 and the flange portion 252 may be created by cutting a groove 254 in each post 250 (e.g., as shown in FIG. 17). Each post 250 may initially have a diameter that is the same as the diameter of the flange portion 252 along the entire length of the post 250. After the groove 254 is cut, the shaft 251 may be formed having the diameter that is smaller than the diameter of the flange portion 252.

The faceplate subassembly 240 may further comprise clips 260 received between the back cover 238 and the flange portions 252 of the posts 250 to couple the carrier, the circuit board, and the back cover 238 to the faceplate 230 (e.g., in a similar manner as for faceplate subassembly 140). The faceplate 230 may include any appropriate number of posts 250. For example, as illustrated in FIGS. 14 and 15, the faceplate 230 may include six posts 250 (although fewer or more may be used). The posts 250 may be positioned in sufficient proximity to the buttons to provide sufficient stiffness for the faceplate subassembly 204 when a button is depressed by a user.

Figure 18:
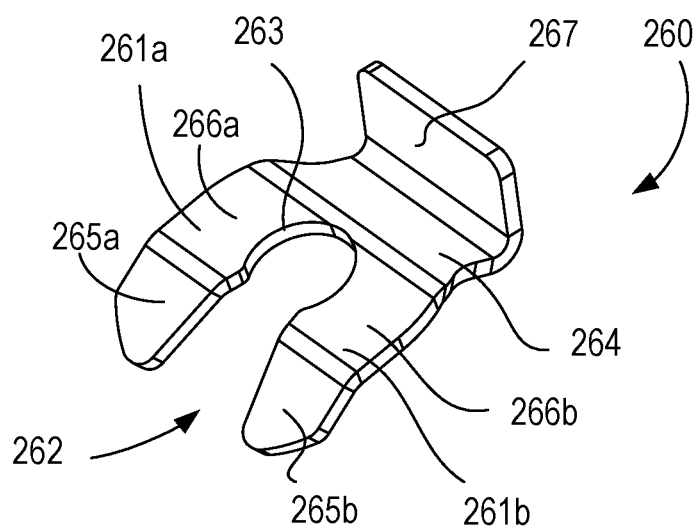
FIG. 18 is an enlarged perspective view of a clip of the faceplate subassembly of FIG. 14.

FIG. 18 is an enlarged perspective view of one of the clips 260. The clip 260 may comprise two prongs 261a, 261b that form a slot 262 having a circular end portion 263. The clip 260 may comprise a base portion 264 that connects the two prongs 261a, 261b. Each prong 261a, 261b may comprise respective tip portions 265a, 265b, and respective intermediate portions 266a, 266b that extend between the tip portions 265a, 265b and the base portion 264. The base portion 264, the tip portions 265a, 265b, and the intermediate portions 266a, 266b may be planar. The base portion 264 and the tip portions 265a, 265b may be angled (e.g., in the same direction) with respect to the intermediate portions 266a, 266b. The slot 262 may be configured to receive the cylindrical shaft 251 of the post 250. When the cylindrical shaft 251 of the post 250 is located in the circular end portion 263 of the slot 262, the intermediate portions 266a, 266b may contact the flange portion 252 of the post 250, and the base portion 264 and the tip portions 265a, 265b may contact the back cover 238 (e.g., as shown in FIG. 17). The clips 260 may operate to bias the back cover 238 towards the rear surface 144 of the faceplate 230 (e.g., towards the recessed portion 148 of the rear surface 144). When one of the clips 260 is inserted between the flange portion 252 of the respective post 250 and the back cover 238, the base portion 264 and the tip portions 265a, 265b of the clip 160 may bend, such that the intermediate portions 266a, 266b apply a force on the flange portion 252 (e.g., the outer side of the groove 254) of the respective post 250, and the base portion 264 and the tip portions 265a, 265b apply an equal and opposite force on the back cover 138.

Figure 19:
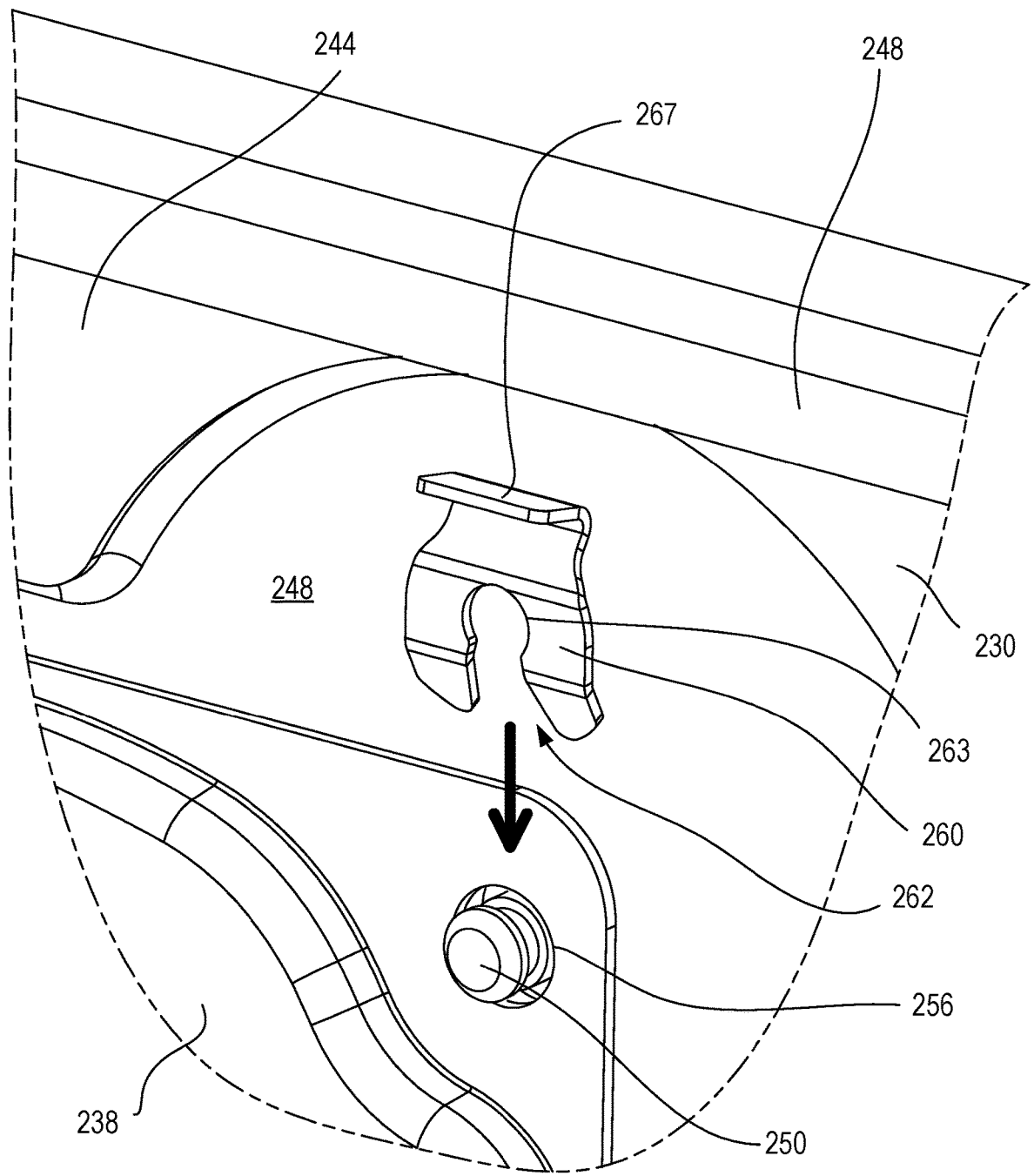
FIG. 19 is a partial enlarged perspective view showing a clip detached from a respective post of the faceplate subassembly of FIG. 14.

FIG. 19 is a partial enlarged rear perspective view of the faceplate subassembly 204 showing one of the clips 260 detached from a respective post 250. The post 250 may be received through an opening 256 of the back cover 238. During manufacturing of the faceplate subassembly 204, the clips 260 may each be moved in a direction perpendicular to the longitudinal axis of the cylindrical body 251 of the respective post 250 (e.g., as shown in FIG. 19) until the cylindrical body is located in the circular end portion 263 of the slot 262 of the clip 260. Each clip 260 may also comprise a tab 267 that may facilitate insertion and removal of the clip. For example, for removal, the tab 267 may be gripped with a tool (e.g., pliers) and the clip 260 may be pulled away from the respective post 250.

Figure 20:
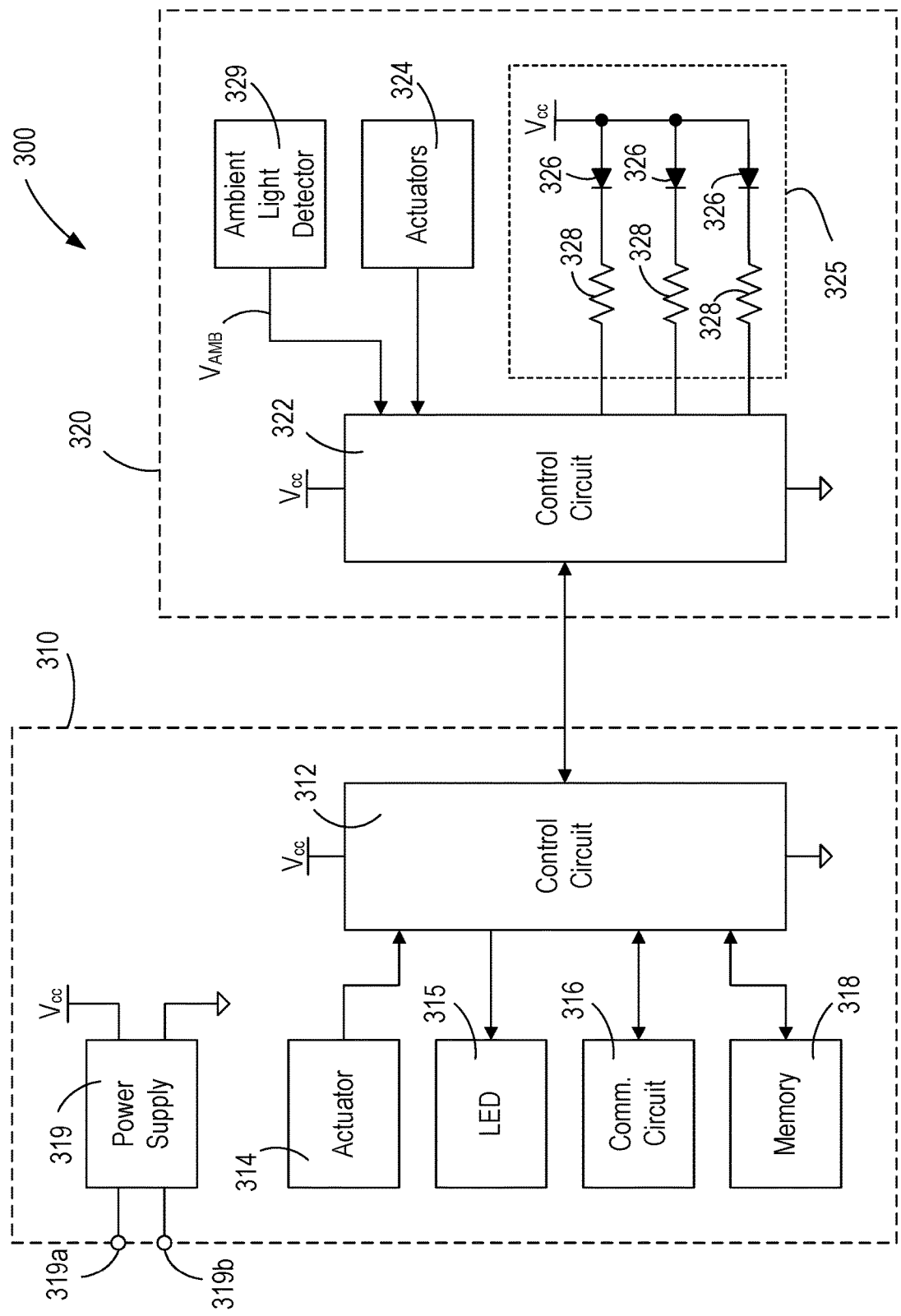
FIG. 20 is a simplified block diagram of an example control device.

FIG. 20 is a simplified block diagram of an example control system 300 that may be deployed as, for example, the keypad 100. The control system 300 may include a main control module 310 (e.g., the main control module 108) and a local control module 320 (e.g., the local control module 135 of the faceplate subassembly 104 and/or the local control module of the faceplate subassembly 204). The main control module 310 may include a main control circuit 312. The main control circuit 312 may include one or more of a processor (e.g., a microprocessor), a microcontroller, a programmable logic device (PLD), a field programmable gate array (FPGA), an application specific integrated circuit (ASIC), or any suitable processing device. The main control module 310 may comprise an actuator 314 that may be actuated in response to actuations of a button (e.g., the actuator 111 of the main control unit 108 of the keypad 100). The main control circuit 312 may be coupled to the actuator 314 for detecting actuations of the button. The main control module 310 may also comprise an LED 315 (e.g., that may illuminate the visible indicator 119 of the main control unit 108 of the keypad 100). The main control circuit 312 may be coupled to the LED 315 to illuminate the LED to provide feedback to a user of the control system 300.

The local control module 320 may comprise a local control circuit 322. The local control circuit 322 may include one or more of a processor (e.g., a microprocessor), a microcontroller, a programmable logic device (PLD), a field programmable gate array (FPGA), an application specific integrated circuit (ASIC), or any suitable processing device. The local control circuit 322 of the local control module 320 may be configured to communicate with the main control circuit 312 of the main control module 310, for example, via a digital communication link, such as a wired or wireless communication link (e.g., a radio-frequency communication link). For example, the wired communication link between the main control circuit 312 and the local control circuit 322 may be provided via a cable (e.g., the cable 192 of the keypad 100). The local control module 320 may also comprise one or more actuators 324 (e.g., the mechanical switches of the keypad 100), which may be actuated in response to actuations of one or more buttons (e.g., the buttons 132 of the keypad 100). The local control circuit 322 may be electrically coupled to the actuators 324 for receiving user inputs.

The main control circuit 312 may be configured to disable the operation of the actuator 314 and the LED 315 when the main control module 310 is connected to the local control module 320 (e.g., when the cable is connected between the main control module 310 and the local control module 320). For example, the main control circuit 312 may be configured to attempt to communicate with the local control circuit 322 and detect that the cable is connected between the main control module 310 and the local control module 320 when the main control circuit 312 receives a response from the local control circuit 322. The main control circuit 312 may ignore actuations of the actuator 314 and may not illuminate the LED 315 when the main control module 310 is connected to the local control module 320. The main control circuit 312 may enable (e.g., re-enable) operation of the actuator 314 and the LED 315 in response to detecting that the main control module 310 is not connected to the local control module 320. For example, the main control circuit 312 may be configured to attempt to communicate with the local control circuit 322 and detect that the cable is not connected between the main control module 310 and the local control module 320 when the main control circuit 312 does not receive a response from the local control circuit 322.

The main control module 310 may further comprise a communication circuit 316, such as, a wired communication circuit and/or a wireless communication circuit (e.g., an RF transmitter coupled to an antenna for transmitting RF signals). The main control circuit 312 may be coupled to the communication circuit 316 for transmitting messages (e.g., digital messages) in response to actuations of the actuators 324 of the local control module 320 (e.g., in response to depression of one of the buttons 132). For example, the main control circuit 312 may be configured to transmit a message for controlling the electrical load (e.g., including a command for controlling the electrical load) via the communication circuit 316 in response to an actuation of one of the actuator 324 (e.g., one of the buttons 132). Additionally or alternatively, the communication circuit 316 may include an RF receiver for receiving RF signals, an RF transceiver for transmitting and receiving RF signals, or an infrared (IR) transmitter for transmitting IR signals. In addition, the main control circuit 312 may be configured to receive a message (e.g., a digital message) including, for example, a selected preset and/or the status of an electrical load controlled by an external load control device.

The main control module 310 may also include a memory 318 communicatively coupled to the main control circuit 312. The main control circuit 312 may be configured to use the memory 318 for the storage and/or retrieval of, for example, commands and/or preset information to transmit in response to actuations of the actuators 324 of the local control module 320. The memory 318 may be implemented as an external integrated circuit (IC) or as an internal circuit of the main control circuit 312.

The local control module 320 may include an illumination circuit 325 for illuminating gaps around the buttons (e.g., the gaps around the buttons 132 of the keypad 100). For example, the illumination circuit 325 may comprise one or more LEDs 326 (e.g., the LEDs 170), such as three LEDs as shown in FIG. 20, which may be coupled to respective ports on the local control circuit 322 via respective resistors 328. The local control circuit 322 may be configured to individually turn each LED 326 on by pulling the respective port low towards circuit common, such that the LED is coupled between the supply voltage $V_{CC}$ and circuit common through the respective resistor 328. The local control circuit 322 may be configured to dim the illumination of each LED 326, e.g., by pulse-width modulating an LED current conducted through each LED and adjusting a duty cycle of the respective pulse-width modulated LED current. While the control system 300 shown in FIG. 20 has one LED 326 for illuminating each of the buttons, each LED illustrated in FIG. 20 may comprise one or more LEDs coupled in series or parallel. For example, each LED 326 in FIG. 20 may comprise two LEDs coupled in series (e.g., the two LEDs 170 adjacent to each contact patch 171 shown in FIG. 7).

The local control circuit 322 may be configured to control the illumination circuit 325 to provide feedback to a user of the control system 300. The local control circuit 322 may be configured to illuminate the gap around one of the buttons (e.g., by blinking and/or strobing the illumination) when that button is actuated or depressed (e.g., to indicate that the local control circuit 322 has received the input and/or the communication circuit 316 is transmitting a message to external load control devices). The local control circuit 322 may be configured to illuminate the gap around one of the buttons to indicate the status of one or more associated electrical loads (e.g., status information regarding whether the electrical loads are on or off). The local control circuit 322 may be configured to illuminate the gap around one of the buttons to indicate the selection of a respective preset associated with the button. For example, the local control circuit 322 may control the illumination circuit 325 to illuminate the gap around the button of the selected preset to a first intensity level and to illuminate the gaps around each of the other buttons to a second intensity level that may be less than the first intensity level. In addition, the local control circuit 322 may be configured to control the illumination circuit 325 to illuminate the gaps around the buttons (e.g., to a dim level) to provide a nightlight feature.

The control system 300 may further comprise an ambient light detector 329 (e.g., an ambient light detection circuit)—for example, as part of the local control module 320—for measuring an ambient light level $L_{AMB}$ in the room in which the control system 300 is installed. The ambient light detector 330 may generate an ambient light detect signal $V_{AMB}$, which may indicate the ambient light level and may be received by the local control circuit 322. The local control circuit 322 may be configured to adjust duty cycles of the LED currents conducted through the LEDs 326 to adjust the intensities of LEDs in response to the measured ambient light level $L_{AMB}$ as determined from ambient light detect signal $V_{AMB}$. For example, the local control circuit 322 may be configured to increase the intensities of the LEDs 326 when the ambient light level increases, and decrease the intensities of the LEDs 326 when the ambient light level decreases. Examples of keypads that control the intensities of LEDs in response to ambient light detectors are described in greater detail in commonly-assigned U.S. Pat. No. 9,763,302, issued Sep. 12, 2017, entitled CONTROL DEVICE HAVING BUTTONS WITH MULTIPLE-LEVEL BACKLIGHTING, and U.S. Pat. No. 9,860,952, issued Jan. 2, 2018, entitled CONTROL DEVICE HAVING BUTTONS WITH AUTOMATICALLY ADJUSTABLE BACKLIGHTING, the entire disclosures of which are hereby incorporated by reference.

While FIG. 20 illustrates the main control module 310 and the local control module 320 with each having a control circuit (e.g., the main control circuit 312 and the local control circuit 322), in other embodiments, the control system 300 may comprise a single control circuit. For example, the control circuit 310 of the main control module 302 may be coupled (e.g., directly coupled) to the actuators 322, the illumination circuit 325, and the ambient light detector 329 (e.g., via the cable 192).

The main control module 310 may also comprise a power supply 318 for generating a direct-current (DC) supply voltage $V_{CC}$ for powering the main control circuit 310, the communication circuit 316, the memory 318, and the other low-voltage circuitry of the main control module, as well as the local control circuit 322, the actuators 324, the illumination circuit 325, and the ambient light detector 329 of the local control module 320. The power supply 319 may be coupled to an AC power source or an external DC power source via electrical connections 319a, 319b (e.g., with the connectors 120). Alternatively, the control system 300 may comprise an internal power source (e.g., one or more batteries) in place of, or for supplying power to, the power supply 319. In various embodiments, the main control module 302 is directly coupled to the power supply 319 and the local control module 304 receives power from the main control module 108 via a cable connection (e.g., the cable 192 of keypad 100).

The control system 300 may further comprise an internal load control circuit (not shown) that may be coupled between a power source (e.g., an alternating-current power source or a direct-current power source) and the electrical load for controlling the power delivered to the electrical load. The control circuit 310 may be configured to control the load control circuit to control the power delivered to the electrical load in response to the actuation of one or more of the buttons.

Figure 21:
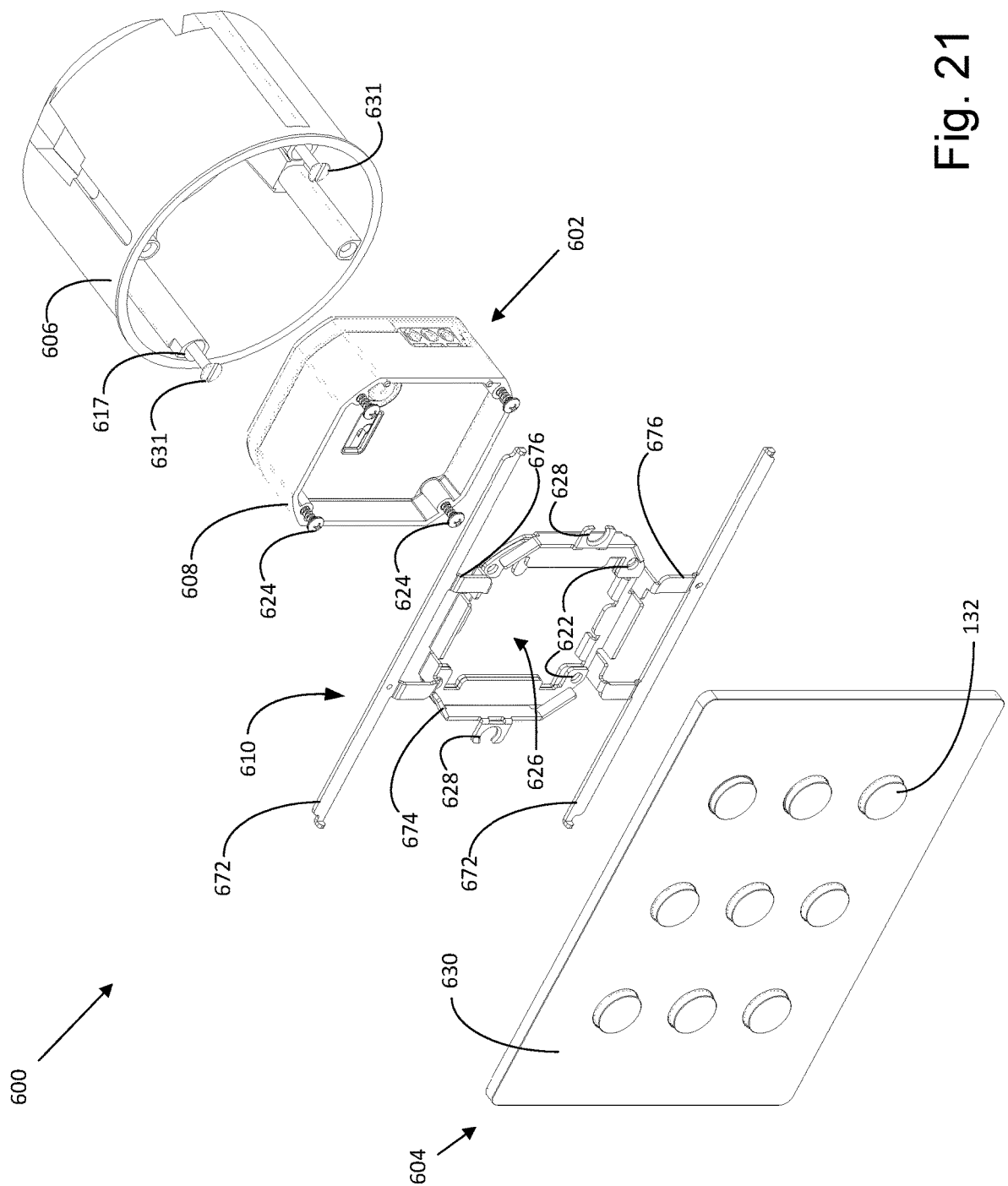
FIG. 21 is an exploded perspective view of an example control device (e.g., a wall-mounted keypad) for use in a load control system for controlling the amount of power delivered to one or more electrical loads.
Figure 23:
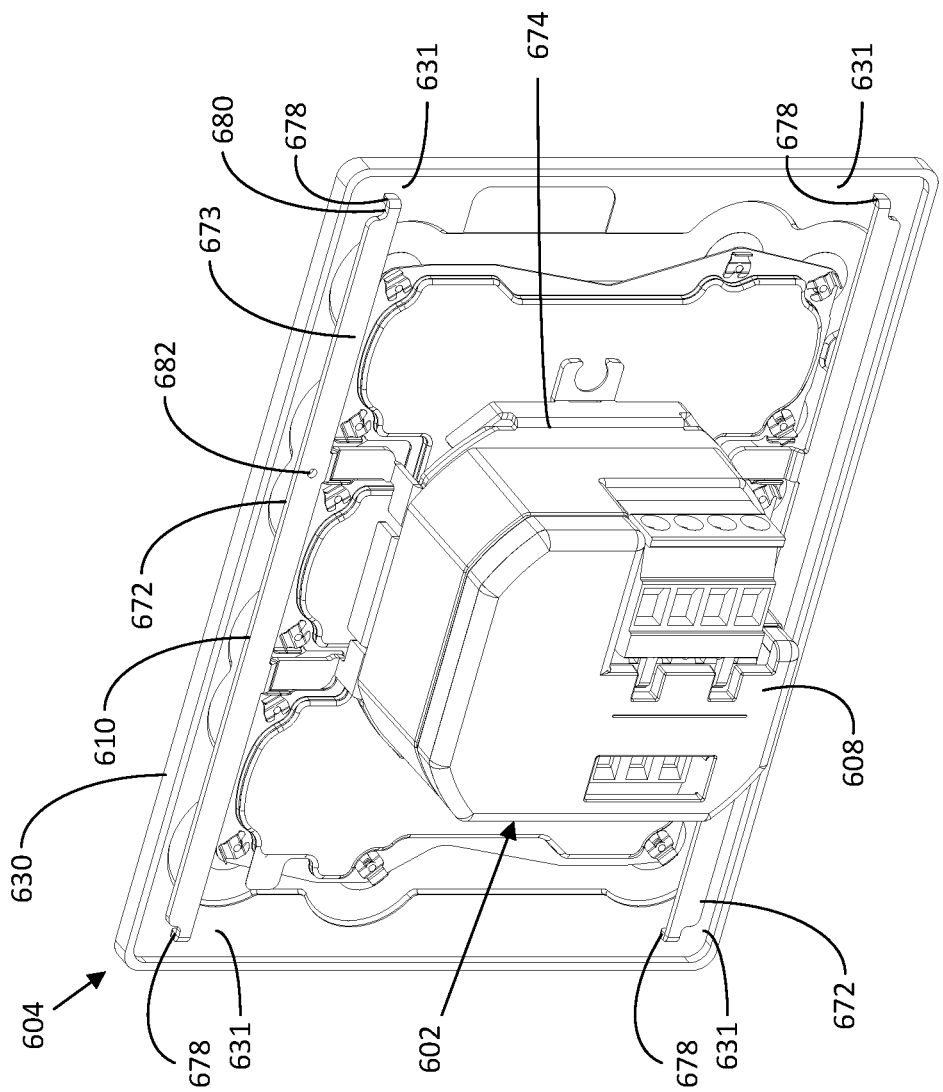
FIG. 23 is rear perspective view of the control device of FIG. 21.

FIG. 21 is an exploded front perspective view of another example control device (e.g., a wall-mounted keypad 600) for controlling the amount of power delivered to one or more electrical loads (e.g., lighting loads), for example, as part of a load control system. FIG. 22 shows a front perspective view of the keypad 600, and FIG. 23 shows a rear perspective view of the keypad 600. The keypad 600 is similar to the keypads 100 discussed above with reference to FIGS. 1-11 and FIGS. 14-19 and similar description is not repeated herein. The keypad 600 may be configured to mount to a wall box 606 (as shown in FIG. 21) when installed in a wall of a home or building. The keypad 600 may be capable of mounting to a variety of types of wall boxes, including those found in different territories throughout the world, such as a circular wall box 606 (as illustrated) commonly used in Europe, a square wall box (as illustrated in FIG. 3) commonly used in the United States, and/or any other suitable wall box.

The wall-mounted keypad 600 includes a faceplate subassembly 604 that includes a faceplate 630, a main control module subassembly 602 that includes a main control module 608 and a mounting bracket 610. The faceplate subassembly 604 is similar to the faceplate subassemblies 104, 204 previously discussed (with faceplate subassembly 604 shown in the figures using posts and clips similar to posts 250 and clips 260 of faceplate subassembly 204), and the main control module 608 is similar to the main control module 108 previously discussed, and similar description is not repeated herein.

Figure 24:
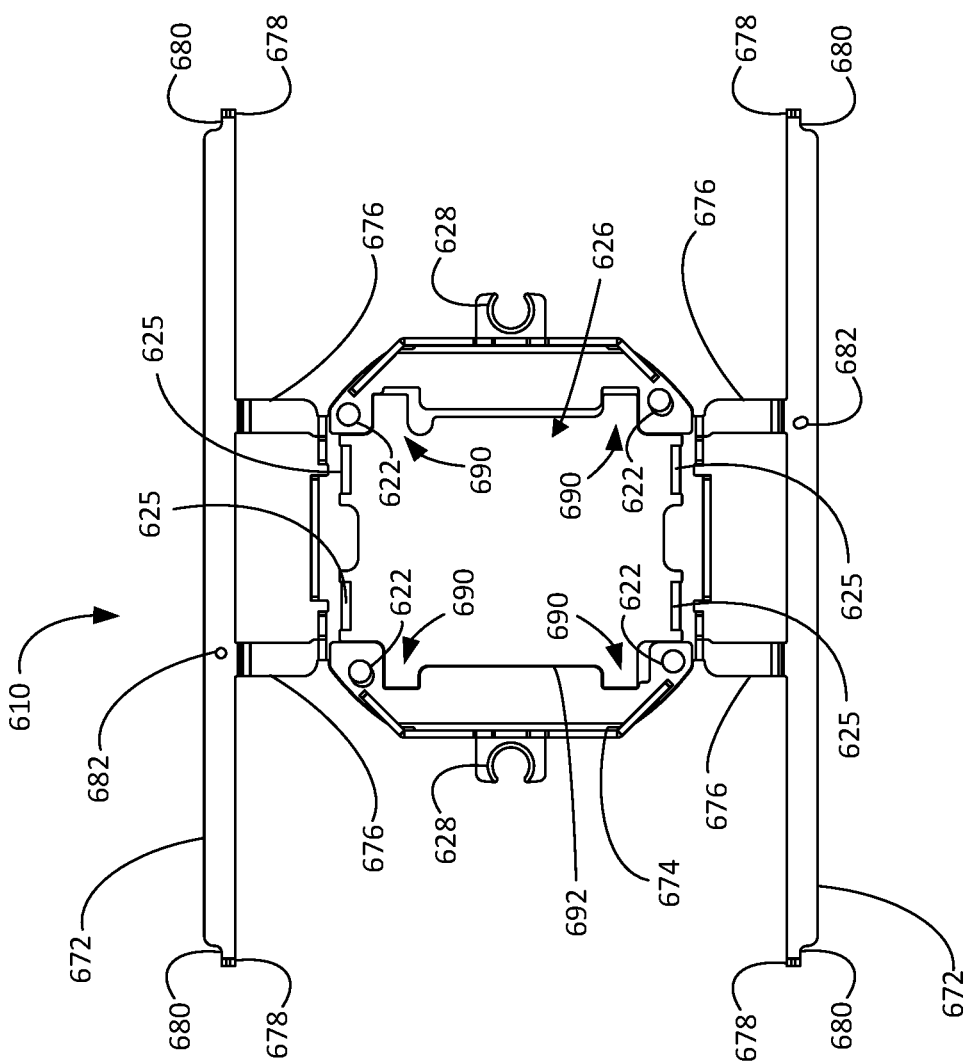
FIG. 24 is a front view of the mounting bracket of the control device of FIG. 21.

FIG. 24 shows a front view of the mounting bracket 610. The mounting bracket 610 may be configured to be attached to the main control module 608 using any appropriate technique, thereby forming the main control module subassembly 602. For example, the mounting bracket 610 may include one or more holes 622 for receiving the screws 624 to couple the mounting bracket 610 to the main control module 608. It should be understood that other forms of attachment may be used to couple the mounting bracket 610 to the main control module 608, such as snaps, flex arms, etc. In other embodiments, the main control module 608 is not positively connected to the mounting bracket 610 and is, instead, able to "float" in the wall box 106 when installed therein. In still other embodiments, the main control module 608 is formed integrally with the mounting bracket 610.

The mounting bracket 610 may further include one or more apertures or cutouts 628, each sized and configured to receive a screw 631 to mount the main control module 608 and/or the mounting bracket 610 (e.g., a main control module subassembly 602) to the wall box 606. When assembled, the mounting bracket 610 may be coupled directly to the wall box 606 via screws 631, and the main control module 608 may be coupled directly to the mounting bracket 610 via screws 624. In various embodiments, the cutouts 628 may be replaced with slotted (i.e., elongated) openings to allow for adjustment of the position of the main control module subassembly 602 relative to the wall box 606. In various embodiments, the keypad 600 or the wall box 606 may also allow for adjustment of the rotational position of the faceplate subassembly 604 (e.g., in the plane of the wall to which the keypad 600 is mounted) to allow the keypad 600 to be aligned as desired. The position of the cutouts 628 may be selected to accommodate any suitable wall box 606, such as, for example, a circular wall box (as illustrated), a square wall box, and/or any other suitable wall box.

Figure 25:
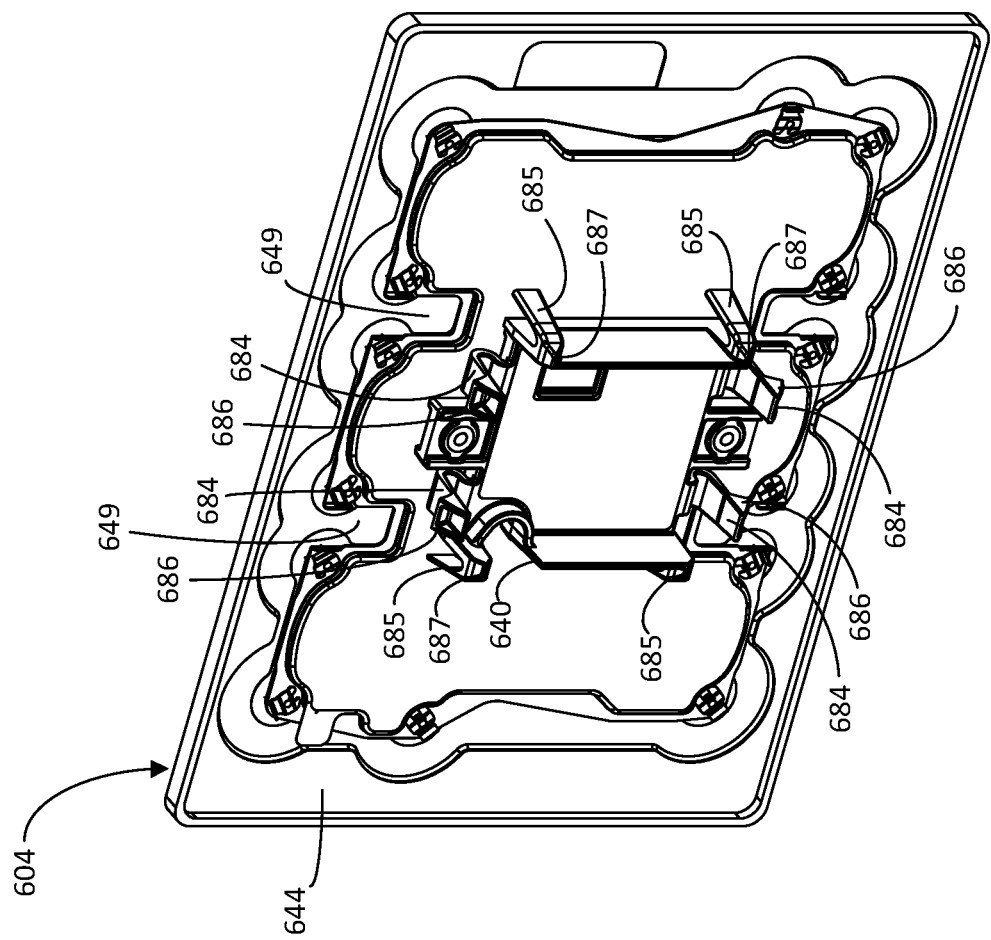
FIG. 25 is a rear perspective view of the faceplate of the control device of FIG. 21.

The mounting bracket 610 may include parallel wall arms 672 positioned above and below a body 674 of the mounting bracket 610. The wall arms 672 are coupled to the body 674, for example, by one or more connector arms 676. In other embodiments, the wall arms 672 may be formed integrally with and/or extend directly from the body 674. The wall arms 672 are configured to apply a force to a planar surface, such as a wall. The wall box 606 may be flush with or recessed with respect to the planar surface such that a rear surface 673 of the wall arms 672 contact a portion of the planar surface when the mounting bracket 610 is coupled to the wall box 606. In the illustrated embodiment, the wall arms 672 extend in a first direction (e.g., a substantially horizontal direction) with respect to the body 674 and the connector arms 676 extend in a second direction (e.g., substantially vertical direction) with respect to the body 674, although it will be appreciated that any suitable arrangement, such as vertical wall arms and horizontal connector arms and/or diagonal arms, may be used. The connector arms 674 may be configured to be positioned within a recess defined by the faceplate subassembly 604 when the faceplate subassembly 604 is coupled to the mounting plate 610. For example and as best seen in FIG. 25, the rear surface 644 of faceplate 630 may include recesses 649 that provide clearance for the connector arms 676 of the mounting bracket 610 when the faceplate subassembly 604 is coupled to the mounting bracket 110. In some embodiments, one or more recesses may be provided for receiving wall arms 672. Further, although embodiments are illustrated having two parallel wall arms 672 positioned at a top and bottom of the mounting bracket 610, it will be appreciated that the wall arms 672 and/or connector arms 676 may be configured in alternative arrangements based on the size and/or design of the faceplate subassembly 604.

The wall arms 672 are configured to extend a predetermined distance beyond an edge (e.g., an outer or outermost edge) of the body 674. For example, as shown in FIG. 23, the wall arms 672 extend a distance substantially close to, but less than, the horizontal width of the faceplate subassembly 604. In other embodiments, the wall arms 672 may extend a horizontal distance substantially less than the horizontal width of the faceplate subassembly 604. In some embodiments, wall arms 672 may extend beyond the outer dimensions of a wall box (e.g., wall box 606) in which the main control module 608 is disposed. This is particularly useful in embodiments in which the faceplate also extends beyond the width of the wall box 606, such as the faceplate 630 illustrated in FIG. 21 in which the two outer columns of buttons would be positioned outside of the wall box 606. As discussed in greater detail below, when the faceplate subassembly 604 is coupled to the mounting bracket 610, the wall arms 672 (in addition to the connector arms 674) are configured to prevent rotation and/or rocking of the faceplate with respect to the planar surface (e.g., a wall). Although embodiments are illustrated with two parallel wall arms 672, it will be appreciated that additional designs, such as four L-shaped wall arms (e.g., orthogonally divergent arms) extending from each corner of the mounting plate 610, may be used.

In some embodiments, the connector arms 676 may have a predetermined curvature and/or offset. The curvature of the connector arms 676 may be configured to position the wall arms 672 slightly out of plane with the connector arms 676, allowing the wall arms 672 to apply a force against a planar surface when the mounting bracket 610 is coupled to a wall box 606. The force applied by the wall arms 672 prevent movement of the mounting bracket 610 and the faceplate subassembly 604 (when the faceplate subassembly 604 is coupled to the mounting bracket 610, as discussed in greater detail below). In some instances, the wall box 606 may include a flange that abuts and/or covers a portion of the planar surface. The curvature of the connector arms 676 may be configured to extend over the flange of the wall box 606 and to position the wall arms 672 in contact with the planar surface, i.e., at a sufficient distance to avoid contacting the flange of the wall box 606.

In some embodiments, the wall arms 672 may include orthogonal pegs 678 (e.g., orthogonal to wall arms 672 and the planar surface) extending from the terminal ends 680 of the wall arms 672. The orthogonal pegs 678 extend away from the wall arms 672 in a direction towards the faceplate subassembly 604 when the faceplate subassembly 604 is coupled to the mounting bracket 610. The orthogonal pegs 678 may be configured to contact the rear surface 631 of the faceplate 630 of the faceplate subassembly 604 when the faceplate subassembly 604 is coupled to the mounting bracket 610. The orthogonal pegs 678 may be configured to prevent flexing or indenting of the faceplate subassembly 604. In some embodiments, the orthogonal pegs 678 apply a biasing force to the rear surface of the faceplate 630 of faceplate subassembly 604.

In some embodiments, each of the wall arms 672 includes at least one opening 682 sized and configured to receive a screw, pin, or other fixation element therethrough. For example, the opening 682 may be configured to receive an alignment pin coupled to a shim positioned between one of the wall arms 672 and the planar surface. The shim may be configured to position the wall arms 672 a predetermined distance from the planar surface. As another example, the opening 682 may be configured to receive a screw to couple the mounting bracket 610 directly to the planar surface, such as a wall. A screw inserted through the at least one opening 682 may be used to position the wall arm 672 flush against the planar surface, prevent rotation of the mounting bracket 610, and/or otherwise additionally couple the mounting bracket 610 to the planar surface.

FIG. 25 is a rear perspective view of the faceplate subassembly 604 illustrating an attachment member 640 formed integrally with and/or coupled to the faceplate subassembly 604. The attachment member 640 is similar to the attachment member 140, 240 discussed above, and similar description is not repeated herein. The attachment member 640 may include one or more flex arms 684, each including a projection 686. In some embodiments, the projections 686 may include one or more teeth, which may be similar to teeth 188 described above, disposed along a surface thereof. The flex arms 684 and the projections 686 may be configured to attach the faceplate subassembly 604 to the mounting bracket 610. For example, in the illustrated embodiment, the mounting bracket 610 may include one or more flanges 625 (similar to flanges 125 described above) that inwardly extend into opening 626 (similar to opening 126 described above). The flex arms 684 and their associated projections 686 may be pressed into engagement with the flanges 625, which may result in the flex arms 684 being flexed such that the projections 686 may wrap around the flanges 625. Put another way, the projection 686 of the flex arm 684 is compressed during insertion and expands when the projection 686 extends beyond the flange 625 of the mounting plate 610 to engage the inner perimeter 692 that defines opening 626 to couple the faceplate subassembly 604 to the mounting plate 610. Once the projections 686 clear the flanges 625, the faceplate subassembly 604 may be secured to the mounting bracket 610. In some embodiments, the arms 684 may remain flexed when the projection wraps around or otherwise engages respective flanges 625. In embodiments in which projections 686 include teeth, the teeth of the projections may engage a flange 625.

The mounting bracket 610 may also define a plurality of channels 690 formed in an inner perimeter 688 of the body of the bracket and defined by an opening 626. In some embodiments, the channels 690 are formed such that they are in communication with and part of the opening 626. Each channel 690 may be configured to receive a respective tower 685 of attachment member 640 that extends in a common direction with the flex arms 684. The towers 685 may be received in the channels 690 and ensure the faceplate subassembly 604 is aligned properly with the mounting bracket 610 and does not rotate clockwise/counterclockwise relate to the surface of the wall. As shown in FIG. 25, the towers 685 may taper along their length such that the towers 685 are wider at their base, e.g., adjacent to faceplate 630, than they are at their terminal end 687. Although specific embodiments are discussed herein, it will be appreciated that any suitable coupling mechanism may be used to couple the faceplate subassembly 604 to the mounting bracket 610, such as, for example, clips, flex arms, screws, etc.

FIG. 26 is a front perspective view of a keypad 700. The keypad 700 is similar to the keypads previously discussed, such as keypad 600, and similar description is not repeated herein. The keypad 700 includes a mounting plate (not shown), such as mounting plate 610 discussed above. The faceplate 730 includes two parallel columns of buttons 132, with each column including three buttons. It will be appreciated that the smaller horizontal width of the keypad 700, for example as compared to the keypad 600, may necessitate shorter wall arms 672 on the mounting plate 610. The mounting plate 610, and the other components of the various keypads discussed herein, can be adapted to accommodate any faceplate having any horizontal width and any number of columns of buttons. Although embodiments are discussed herein including wall arms 672 positioned at a top and bottom of the mounting plate 610, it will be appreciated that the mounting plate 610 may be rotated such that the wall arms 672 extend vertically or diagonally. Such a configuration may be used for mounting the faceplates 630, 730 in a vertical or angled arrangement, and is within the scope of this disclosure.

FIG. 27 is a front perspective view of another example of a keypad 800. The keypad 800 is similar to the keypads previously discussed, such as keypads 600, 700, and similar description is not repeated herein. The keypad 800 includes a mounting plate, such as mounting plate 610 discussed above. The faceplate 830 includes two parallel rows of buttons 132, with each row including three buttons. It will be appreciated that the keypad 800 may have a smaller vertical height than the keypad 700. In some embodiments, the keypad 800 may have shorter connector arms 676 compared to the keypad 700.

While the foregoing description and drawings represent preferred or exemplary embodiments of the subject matter described herein, it will be understood that various additions, modifications and substitutions may be made therein without departing from the spirit and scope and range of equivalents of the accompanying claims.

What is claimed is:

1. A control device for controlling power delivered to an electrical load, the control device comprising:
    a faceplate subassembly including a front surface, an opposed rear surface, and an attachment member, the attachment member including at plurality of arms extending away from the rear surface of the faceplate subassembly;
    a main control module configured to cause power delivered to an electrical load to be adjusted in response to an actuation of a button; and
    a mounting bracket comprising a body defining an opening, the body including a plurality of flanges with each flange of the plurality of flanges extending into the opening,
    wherein the mounting bracket is configured to be coupled to the main control module,
    wherein each arm of the plurality of arms of the attachment member is configured to engage a respective flange of the body of the mounting bracket for coupling the faceplate subassembly to the mounting bracket, and
    wherein the body of the mounting bracket includes at least one arm extending beyond an outer edge of the body of the mounting bracket.

2. The control device of claim 1, wherein the mounting bracket includes at least one aperture sized and configured to receive a screw for coupling the mounting bracket to a wall box, and wherein the mounting bracket is configured to be coupled to the main control module by at least one second screw.

3. The control device of claim 1, wherein each arm of the plurality of arms of the attachment member is configured to flex.

4. The control device of claim 1, wherein each flange curves away from a front side of the body.

5. The control device of claim 1, wherein the at least one arm of the mounting bracket is sized and arranged to extend beyond a wall box when the mounting bracket is coupled to the wall box.

6. The control device of claim 1, wherein the at least one arm of the mounting bracket includes an orthogonal extension extending from a terminal end of the at least one arm, the orthogonal extension configured to apply a force against the faceplate subassembly when the faceplate subassembly is coupled to the mounting bracket.

7. The control device of claim 1, wherein the at least one arm of the mounting bracket is coupled to the body of the mounting bracket by one or more connector arms.

8. The control device of claim 7, wherein the at least one arm of the mounting bracket extends in a first direction, and the one or more connector arms extend in a second direction that is different from the first direction.

9. The control device of claim 7, wherein the one or more connector arms are curved.

10. The control device of claim 9, wherein the rear surface of the faceplate subassembly includes one or more recesses for providing clearance for the one more connector arms.

11. The control device of claim 10, wherein a thickness of the faceplate subassembly is less between the front surface and the one or more recesses and between the front surface and other areas of the rear surface of the faceplate subassembly.

12. The control device of claim 1, wherein the mounting bracket defines at least one channel, the at least one channel sized and configured to receive a tower extending from a surface of the attachment member for aligning the faceplate subassembly relative to the mounting bracket.

13. A mounting bracket for coupling a control device to a wall box, comprising:
   a body having an inner perimeter defining an opening, a plurality of flanges extend into the opening, each flange of the plurality of flanges configured to be engaged by an arm of a faceplate for coupling the faceplate to the mounting bracket,
   wherein the body includes at least one arm that extends beyond an outer edge of the body.

14. The mounting bracket of claim 13, wherein the inner perimeter of the body defines at least one channel, the at least one channel sized and configured to receive a tower of an attachment member of the faceplate for aligning the faceplate with the mounting bracket.

15. The mounting bracket of claim 13, wherein the body defines at least one first aperture sized and configured to receive a first screw for coupling the body of the mounting bracket to a wall box, and wherein the body defines at least one second aperture for coupling the body to the control module.

16. The mounting bracket of claim 13, wherein the at least one arm is coupled to the body of by one or more connector arms.

17. The mounting bracket of claim 16, wherein the at least one arm extends in a first direction and the one or more connector arms extend in a second direction that is different from the first direction.

18. The mounting bracket of claim 13, comprising at least one orthogonal extension extending from a terminal end of the at least one arm, the orthogonal extension is configured to apply a force against the faceplate when the faceplate is coupled to the mounting bracket.

19. A control device, comprising:
   a faceplate subassembly, comprising:
      a faceplate, wherein the faceplate comprises a front surface and an opposed rear surface, and an opening extending between the front surface and the rear surface, the opening defined by a sidewall;
      a button disposed in the opening such that a gap exists between the button and the sidewall defining the opening; and
      a local control module coupled to the faceplate, the local control module comprising a circuit board positioned adjacent to the rear surface of the faceplate, such that depression of the button actuates a contact on the circuit board;
   a main control module subassembly comprising a body and a main control module configure to be electrically connected to the local control module and configured to:
      cause power delivered to an electrical load to be adjusted in response to an actuation of the button; and
      control at least one light source to illuminate the gap between the button and the sidewall defining the opening; and
   a mounting bracket configured to be coupled to the main control module subassembly and the faceplate subassembly, the mounting bracket comprising a body defining an opening and including at least one flange that extends into the opening for coupling the faceplate subassembly to the mounting bracket.

20. The control device of claim 19, wherein the faceplate subassembly includes an attachment member, the attachment member including at least one flexible arm configured to engage the at least one flange for coupling the faceplate subassembly to the mounting bracket.

21. The control device of claim 20, wherein the mounting bracket defines at least one channel in communication with the opening, the at least one channel configured to receive a tower extending from the attachment member for aligning the faceplate subassembly with the mounting bracket.

22. The control device of claim 19, wherein the mounting bracket includes at least one arm extending beyond an edge of the body of the mounting bracket.

23. The control device of claim 22, wherein the mounting bracket includes at least one connector arm extending in a first direction from the body, and wherein the at least one arm is coupled to the connector arm and extends in a second direction that is different from the first direction.

24. The control device of claim 23, wherein the rear surface of the faceplate includes one or more recesses for providing clearance for the one more connector arms.

25. The control device of claim 24, wherein a thickness of the faceplate is less between the front surface of the faceplate and the one or more recesses and between the front surface of the faceplate and other areas of the rear surface of the faceplate.

* * * * *